United States Patent
Onuma et al.

(10) Patent No.: US 10,784,416 B2
(45) Date of Patent: Sep. 22, 2020

(54) LIGHT SOURCE DEVICE AND LIGHT EMITTING DEVICE

(71) Applicant: SHARP KABUSHIKI KAISHA, Sakai, Osaka (JP)

(72) Inventors: Hiroaki Onuma, Sakai (JP); Yuhsuke Fujita, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/087,603

(22) PCT Filed: Mar. 22, 2017

(86) PCT No.: PCT/JP2017/011359
§ 371 (c)(1),
(2) Date: Sep. 21, 2018

(87) PCT Pub. No.: WO2017/164214
PCT Pub. Date: Sep. 28, 2017

(65) Prior Publication Data
US 2019/0088832 A1 Mar. 21, 2019

(30) Foreign Application Priority Data
Mar. 24, 2016 (JP) .................................. 2016-060130

(51) Int. Cl.
*H01L 33/50* (2010.01)
*H01L 25/075* (2006.01)
(Continued)

(52) U.S. Cl.
CPC ........ *H01L 33/504* (2013.01); *C09K 11/0883* (2013.01); *C09K 11/7708* (2013.01);
(Continued)

(58) Field of Classification Search
CPC combination set(s) only.
See application file for complete search history.

(56) References Cited

U.S. PATENT DOCUMENTS

| 5,525,860 A * | 6/1996 | Horaguchi | H01J 61/44 313/486 |
| 2007/0235751 A1* | 10/2007 | Radkov | C09K 11/7734 257/103 |

(Continued)

FOREIGN PATENT DOCUMENTS

| JP | 2010-053341 A | 3/2010 |
| JP | 2015-079924 A | 4/2015 |

*Primary Examiner* — Michelle Mandala
*Assistant Examiner* — Jordan M Klein
(74) *Attorney, Agent, or Firm* — ScienBiziP, P.C.

(57) ABSTRACT

Provided is a light source device including: at least one light emitting element of at least one type; at least one far-red phosphor that, when excited by output light from the light emitting element, emits light having a peak in a wavelength range of 680 nm or more to less than 780 nm; and at least one phosphor that, when excited by the output light from the light emitting element, emits light having a peak in a wavelength range different from the wavelength range of the light emitted from the far-red phosphor. The spectrum of light emitted from the light source device has characteristic A below. This light source device has sufficient emission intensity over the entire visible range, i.e., over a wavelength range of from 400 nm to 750 nm inclusive.
Characteristic A: The ratio of a minimum emission intensity to a maximum emission intensity in a wavelength range of from 400 nm to 750 nm inclusive is 20% or more.

6 Claims, 7 Drawing Sheets

(51) Int. Cl.
  *F21V 9/30* (2018.01)
  *F21S 2/00* (2016.01)
  *C09K 11/08* (2006.01)
  *C09K 11/77* (2006.01)
(52) U.S. Cl.
  CPC ...... *C09K 11/7721* (2013.01); *C09K 11/7734* (2013.01); *C09K 11/7792* (2013.01); *F21S 2/00* (2013.01); *F21V 9/30* (2018.02); *H01L 25/0753* (2013.01)

(56) References Cited

U.S. PATENT DOCUMENTS

| | | | | |
|---|---|---|---|---|
| 2008/0106887 A1* | 5/2008 | Salsbury | ................... | F21K 9/64 362/84 |
| 2010/0171440 A1* | 7/2010 | Satou | ................ | C09K 11/0883 315/294 |
| 2010/0296024 A1* | 11/2010 | Ishimaru | ................... | G02B 5/20 349/61 |
| 2014/0009061 A1* | 1/2014 | Itoga | ................... | C09K 11/7734 313/503 |
| 2014/0307417 A1* | 10/2014 | Yamakawa | ............... | F21V 3/04 362/84 |
| 2015/0128489 A1* | 5/2015 | Yamada | ................. | A01G 7/045 47/58.1 LS |
| 2015/0357532 A1* | 12/2015 | Onuma | .............. | C09K 11/7708 257/98 |
| 2016/0000018 A1* | 1/2016 | Van Elmpt | ............. | A01G 7/045 47/17 |
| 2017/0005239 A1* | 1/2017 | Asai | ....................... | H01L 33/504 |
| 2017/0238390 A1* | 8/2017 | Yamakawa | ............... | F21S 2/00 315/294 |
| 2019/0165221 A1* | 5/2019 | Amiya | ................. | H01L 33/504 |

* cited by examiner

LIGHT SOURCE DEVICE AND LIGHT EMITTING DEVICE

TECHNICAL FIELD

The present invention relates to a light source device and to a light emitting device including the light source device. In particular, the invention relates to a light source device including a light emitting element (e.g., an LED (Light Emitting Diode)) that makes an illuminated object look brightly colored.

BACKGROUND ART

A light source device including a light emitting element and a phosphor is receiving attention as a next-generation light source device expected to have low-power consumption, a small size, high brightness, and color reproducibility over a wide range and is undergoing active research and development. Primary light emitted from the light emitting element generally has a peak emission wavelength in the near-ultraviolet to blue range and, for example, has a peak wavelength in a wavelength range of 380 nm or more to less than 490 nm. Light source devices including various phosphors suitable for their applications have also been proposed.

In recent years, there is a need for light sources having emission spectral components with sufficient emission intensity over a wide wavelength range. Specifically, there is a need for light sources for lighting system applications, optical system calibration applications, sensor applications, etc.

For example, research and development has been conducted on light source devices used as light sources of lighting systems. Various means for improving the output performance of these light source devices have been studied. Generally, to improve the output performance of a light source device, a phosphor having a main emission peak in a high-luminosity factor color range complementary to blue (the yellow, green, or red range) is used. A light source device usable as a light source of a common lighting fixture is required to have high color rendering properties (the "high color rendering properties" means basically that the average color rendering index Ra of the light source device is 80 or more) as well as improved output performance.

The color rendering index is an index representing a color shift that occurs when a light source being tested for the color rendering properties irradiates a color sample for color rendering evaluation. The higher the color rendering index, the smaller the color shift. Specifically, the higher the color rendering index, the more correct the light emitted from the light source being tested can make the color of the illuminated object look. There are color rendering indexes R1 to R15, and therefore there are 15 color samples for color rendering evaluation. The average color rendering index Ra is the average of color rendering indexes R1 to R8 among the color rendering indexes R1 to R15 and is commonly used as an index representing the color rendering properties. To improve the color rendering properties, it is desirable that the light source has sufficient emission intensity over a wide region in the visible range.

Besides the lighting systems, there is a need for light source devices for defining a standard optical system for engineering. In photometric systems, it is necessary to correct variations in response sensitivities of the photometric systems individually at different wavelengths, and a standard lamp has been used for the correction. The standard lamp is an incandescent lamp that is guaranteed to have an emission spectrum within a certain reference range. Specifically, the standard lamp is a light bulb that emits light with a certain emission spectrum. However, since the standard lamp is a light bulb, the light emitted is black-body radiation at about 2,700 to about 3,000K, and the shape of the emission spectrum is such that the emission intensity decreases as the wavelength decreases. Therefore, the influence of correction errors in, for example, a wavelength range shorter than 500 nm is larger than that at 600 nm.

In recent years, various light sources such as lasers and LEDs, as well as traditional light bulbs, fluorescent lights, and HID (High Intensity Discharge) lamps, are used, and a variety of emission spectral shapes are available. In particular, a light source device using a semiconductor solid light source such as a semiconductor laser or an LED emits light with a high intensity peak with a narrow half width. Generally, in an illumination light source using an LED, its spectrum contains a larger amount of a blue component less than 490 nm than the spectrum of a standard light bulb. Therefore, to improve the correction accuracy of a photometric system for measuring various light sources having different emission spectra, it is desirable to use a light source with sufficient emission intensity over a wide wavelength range.

In recent years, various optical sensing techniques are being developed, and there is a need for light source devices for the sensing applications. For example, one exemplary conventional sensing technique is distance measurement using infrared light of, for example, 830 nm. Moreover, two narrow band wavelengths (390 to 445 nm and 530 to 550 nm) that are easily absorbed by hemoglobin in blood are used to observe the stomach and intestine. This allows capillary vessels and a fine mucous pattern in a mucous membrane surface layer to be observed more clearly.

A human adjusts perceived color tones through chromatic adaptation that is the brain's ability to adapt to the surrounding light environment. However, by recognizing the small difference in reflection characteristics between different wavelengths as described above, objects invisible or less visible to the human eye can be detected. Sensing in the visible range has relied on the human eye. However, as described above, the potential use of the sensing in the visible range is increasing. To achieve this, there is a need for a high-sensitivity detector and signal processing software, and there is also a need for a light source device having an emission spectrum with an emission intensity sufficient for sensing over a wide wavelength region in the visible range.

When a small and light-weight light source device is used for a sensing apparatus, the sensing apparatus can be reduced in size and installed in other devices, so its applicability is widened. In consideration of this, light source devices using LEDs and phosphors are more advantageous than light bulbs and fluorescent lamps.

Light source devices having an emission component in the far-red range, which is a wavelength range in which the sensitivity of the human eye is low, are used mainly to grow plants. This is because light in a wavelength range of 400 to 500 nm and light in a wavelength range of 600 to 800 nm facilitate photosynthesis. International Publication No. 2010/053341 (PTL 1) reports a light source device that uses a light emitting element and a Cr-activated $Gd_3Ga_5O_{12}$ (GGG) phosphor, which is a far-red phosphor.

In illumination applications, for the purpose of improving color rendering properties, light source devices having emission components in a wider wavelength range within the visible range have been reported.

CITATION LIST

Patent Literature

PTL 1: International Publication No. 2010/053341
PTL 2: Japanese Unexamined Patent Application Publication No. 2015-79924

SUMMARY OF INVENTION

Technical Problem

In the light source device in PTL 1, a light emitting element that emits output light having a peak wavelength in a wavelength range of 400 nm or more to less than 500 nm is used in combination with a GGG phosphor, which is a far-red phosphor, and optionally a red phosphor. This light source device has a sufficient emission component even in a wavelength range longer than 700 nm. However, the light source device in PTL 1 is aimed at plant growth, particularly promotion of photosynthesis, and does not have a sufficient emission component in the green range of 490 nm or more to less than 580 nm.

In Japanese Unexamined Patent Application Publication No. 2015-79924 (PTL 2), it is stated that a light emitting device having high color rendering properties can be obtained by using a combination of a first light source device (first package) including a blue light emitting element and a trivalent Ce-activated $Y_3Al_5O_{12}$ phosphor (YAG phosphor) and a second light source device (second package) including a near-ultraviolet semiconductor light emitting element, a blue phosphor, and a red phosphor. However, in the light emitting device in PTL 2, an emission component in the far-red range in which the luminosity factor is low is insufficient.

The present invention has been made in view of the foregoing problems, and it is an object to provide a light source device having sufficient emission intensity over the entire visible range, i.e., over the wavelength range of from 400 nm to 750 nm inclusive.

Solution to Problem

The light source device of the present invention includes: at least one light emitting element of at least one type; and a phosphor that is excited by output light from the at least one light emitting element. To achieve the object of the present invention, i.e., to obtain reflection spectrum information over the entire visible range, it is necessary that the light source device, unlike a conventional light source device including a combination of a light emitting element and phosphors, have a sufficient light component at a wavelength of 700 nm or more. Therefore, it is necessary that a phosphor having a peak wavelength in a wavelength range of 680 nm or more to less than 780 nm be included.

The light source device of the present invention further includes at least one phosphor that, when excited by output light from the at least one emitting element, emits light having a peak in a wavelength range different from the wavelength range of the light emitted from the far-red phosphor. The spectrum of light emitted from the light source device has the following characteristic A.

Characteristic A: The ratio of a minimum emission Intensity to a maximum emission intensity in a wavelength range of from 400 nm to 750 nm inclusive is 20% or more.

In the light source device of the present invention, the far-red phosphor is preferably a phosphor represented by $(Ln_{1-x}Cr_x)_3M_5O_{12}$ (where Ln is at least one element selected from Y, La, Gd, and Lu; N is at least one element selected from Al, Ga, and In; and x is a number satisfying $0.005 \leq x \leq 0.2$).

In the light source device of the present invention, it is preferable that, when light is emitted from all of the at least one light emitting element mounted on the light source device with no phosphors mounted thereon, the light emitted has at least one peak wavelength in a wavelength range of 380 nm or more to less than 490 nm. In the light source device of the present invention, it is preferable that, when light is emitted from all of the at least one emitting element mounted on the light, source device with no phosphors mounted thereon, the light emitted has a peak wavelength in a first wavelength range of 380 nm or more to less than 420 nm. In the light source device of the present invention, when light is emitted from all of the at least one light emitting element mounted on the light source device with no phosphors mounted thereon, the light emitted may have, in addition to the peak wavelength in the first wavelength range of 380 nm or more to less than 420 nm, a peak wavelength in a second wavelength range of 420 nm or more to less than 490 nm.

In the light source device of the present invention, when light is emitted from all of the at least one light emitting element mounted on the light source device with no phosphors mounted thereon, the light emitted may have at least one peak wavelength in a wavelength range of 380 nm or more to less than 400 nm and at least one peak wavelength in a wavelength range of 400 nm or more to less than 420 nm within the first wavelength range of 380 nm, or more to less than 420 nm.

In the light source device of the present invention, when light is emitted from all of the at least one light emitting element mounted on the light source device with no phosphors mounted thereon, the light emitted may have at least one peak wavelength in a wavelength range of 420 nm or more to less than 460 nm and at least one peak wavelength in a wavelength range of 460 nm or more to less than 490 nm within the second wavelength range of 420 nm or more to less than 490 nm.

However, the difference between emission peak wavelengths in a wavelength range can be small. In this case, even when the light is emitted from all of the at least one light emitting element mounted on the light source device with no phosphors mounted thereon, the emission peaks observed in the wavelength range may not be clearly separated from each other. Therefore, not only the emission wavelength peaks in the wavelength range but also their integrated intensities are important indexes.

To achieve the object of the present invention, i.e., to obtain reflection spectrum information over the entire visible range, it is preferable to use a light emitting element having an emission peak in a first wavelength range of 380 nm or more to less than 420 nm, and it is more preferable to use a light emitting element having an emission peak in a first wavelength range of 400 nm or more to less than 420 nm. Most light emitting elements have a half width of 20 nm or less, but this depends on the type of light emitting element. Generally, a phosphor that emits light when irradiated with light of 380 nm or more to less than 420 nm has an emission peak wavelength of at least about 430 nm, and its half width is 30 nm or more. Specifically, in view of the emission spectrum of the phosphor and the emission spectrum of the is light emitting element, when the emission peak of the light emitting element is in a wavelength range of 380 nm or more to less than 420 nm, an emission component is present in the target wavelength range of 400 nm or more. When the emission peak of the light emitting element is in a wavelength range of 400 nm or more to less than 420 nm, an emission spectrum with more uniform spectral intensity can be easily obtained. Therefore, when the emission peak is in a wavelength range of 380 nm or more to less than 420 nm and more preferably in a wavelength range of 400 nm or more to less than 420 nm, a light source device having sufficient emission components in the target wavelength range of from 400 nm to 750 nm inclusive can be obtained.

Alternatively, a light emitting element having an emission peak at a shorter wavelength of less than 380 nm nay be used. However, since the object is to obtain an emission spectrum in the visible range, the above light emitting element is disadvantageous in terms of energy. Moreover, it is highly probable that short-wavelength light, i.e., high-energy light, promotes deterioration of its surrounding components. In this regard also, it is disadvantageous to use the light emitting element having an emission peak at a short wavelength.

Moreover, it is preferable that at least one light emitting element that emits output light having a peak wavelength in the second wavelength range includes a light emitting element that emits output light having a peak in a wavelength range of 460 nm or more to less than 490 nm. The at least one light emitting element may include a light emitting element that emits output light having a peak in a wavelength range of 460 nm or more to less than 490 nm and a light emitting element that emits output light having a peak in a wavelength range of more than 420 nm to less than 460 nm.

When a plurality of light emitting elements of the same type are mounted, it is preferable that at least one of the light emitting elements is sealed with a resin layer containing at least one phosphor. At least one of the remaining light emitting elements may be sealed with a resin layer containing no phosphor.

When two or more types of light emitting elements are used, it is preferable that at least one type of light emitting element is sealed with a resin layer containing at least one phosphor. In this case, at least one of the remaining light emitting elements may be sealed with a resin layer containing no phosphor. A signal input system for a second light emitting element (described later) and a signal input system for a light emitting element different in type from the second light emitting element may differ from each other.

To achieve the light emission characteristic described above, one light emitting element having a plurality of emission peaks in their respective wavelength ranges may be used, or a plurality of light emitting elements each having one emission peak in a corresponding wavelength range may be used in combination. Alternatively, a light emitting element having a plurality of emission peaks in their respective wavelength ranges and a light emitting element having one emission peak in a wavelength range may be used in combination.

When a plurality of light emitting elements each having one emission peak in a corresponding wavelength range are used in combination, the emission spectrum of the light source device can be finely controlled by adjusting the combination of the light emitting elements, and an emission spectrum close to the intended spectrum can be easily obtained.

When one light emitting element having a plurality of emission peaks in their respective wavelength ranges is used, the light source device can be configured using only the one light emitting element. This is advantageous in that a process for producing the light source device can be simplified.

A light source device including a plurality of light emitting elements has a plurality of light emitting points present in the light source device. When a plurality of light emitting elements with different wavelengths are used, it is highly probable that light beams with different intensities and colors are emitted from the light emitting points. In this case, the differences in emission color and emission intensity between the light emitting points or the differences in spacing between the light emitting points (variations in the positions of the chips fixed to the substrate) tend to cause color unevenness on a surface irradiated with the light beams. This influence varies depending on the optical system of the light emitting device that includes a reflector, a lens, etc. It is highly probable that the smaller the irradiation angle of the light emitting device, the higher the influence. In a light source device that uses light emitting elements of the same type having a plurality of emission peaks in their respective wavelength ranges, all the light emitting points of the light source device have the same light emission characteristics. In this case, the optical design of the light emitting device is easier than that of a light source device including light emitting elements with different wavelengths, and brightness unevenness and color unevenness on the irradiated surface can be easily reduced. Specifically, to obtain high-quality light with reduced brightness unevenness and color unevenness on an irradiated surface, it is necessary that the light emitted from light emitting elements of a light source device be uniform in light amount and color.

As described above, when light emitting elements of the same type having a plurality of emission peaks in their respective wavelength ranges are used to form a light source device, its production process is simplified. Another advantageous effect is that, since all the tight emitting elements in the light source device have the same characteristics, no brightness unevenness and no color unevenness occur and good optical characteristic can be obtained.

Generally, a light emitting element emits light in a single wavelength range. However, there is a light emitting element that itself can emit light in a plurality of wavelength ranges. For example, an InGaN-based light emitting diode itself can emit light in a plurality of wavelength ranges. Generally, the InGaN-based light emitting diode includes a plurality of light emitting layers in its structure, and the emission wavelengths from these light emitting layers can be designed by controlling the concentrations of In in the light emitting layers. The plurality of light emitting layers are stacked perpendicularly to the light emitting surface of the light emitting element, so that uniform light with no spectral variations can be obtained on the light emitting surface of the light emitting element. In this manner, a light emitting element having a plurality of emission peaks in their respective wavelength ranges can be produced. The use of this light emitting element can provide a light source device that can be produced by a simpler production method and a light source device with reduced brightness unevenness and color unevenness.

The light source device of the present invention includes, for example: a light emitting element that emits output light having a peak wavelength in a wavelength range of 380 nm or more to less than 420 nm; and two or more phosphors each of which emits light when excited by the output light from the light emitting element or secondary light emitted from one of the phosphors excited by the output light from the light emitting element. At least one of these phosphors is at least one far-red phosphor that emits light having a peak in a wavelength range of 680 nm or more to less than 780 nm.

Alternatively, the light source device of the present invention includes, for example; one light emitting element that emits output light having two or more emission peaks at different peak wavelengths; and two or more phosphors each of which emits light when excited by the output light from the light emitting element or secondary light emitted from one of the phosphors excited by the output light from the light emitting element. At least one of these phosphors is at least one far-red phosphor having a peak wavelength in a wavelength range of 680 nm or more to less than 780 nm. The light emitting element emits the output light having a peak wavelength in a first wavelength range of 380 nm or more to less than 420 nm and a peak wavelength in a second wavelength range of 420 nm or more to less than 490 nm.

Alternatively, the light source device of the present invention includes, for example: two or more light emitting elements that emit output light with different peak wavelengths; and three or more phosphors each of which emits light when excited by the output light from one of the light emitting elements or secondary light emitted from one of the phosphors excited by the output light from one of the light emitting elements. At least one of these phosphors is at least one far-red phosphor having a peak wavelength in a wavelength range of 680 nm or more to less than 780 nm. The two or more light emitting elements include: at least one light emitting element that emits output light having a peak wavelength in a first wavelength range of 380 nm or more to less than 420 nm; and at least one light emitting element that emits output light having a peak wavelength in a second wavelength range of 420 nm or more to less than 490 nm.

Generally, the orientational characteristics of the output light from a light emitting element differs from the orientational characteristics of the output light from a phosphor. It is preferable that, when a light source device is used alone or even when the light source device and an optical component attached thereto are used, the light emitting device has the same emission spectrum at any angle. In particular, when the light source device is used for an application that requires light at a small distance from the light source device, e.g., for a light source application for sensing devices, the orientational characteristics of the light source device are important.

It is therefore preferable that a diffusing agent having a light scattering effect that allows a uniform emission spectrum to be obtained irrespective of the angle from the light source is contained in a phosphor-containing sealing resin layer. The higher the concentration of the diffusing agent, the further the orientational characteristics are improved. However, disadvantageously, a reduction in Light extraction efficiency and deterioration in handleability caused by an increase in the viscosity of the resin may occur. The mass percentage of the diffusing agent in the phosphor-containing sealing resin is preferably 0.2% or more and less than 20.0% and more preferably 0.3% or more and less than 5.0%. Examples of the diffusing agent include: inorganic diffusing agents such as silica, alumina, aluminum silicate, calcium carbonate, and calcium silicate; and organic diffusing agents such as polyacrylates and silicone resins.

Examples of the material of a substrate/frame for mounting a chip include PPA (polyphthalamide) resins, PCT (polycyclohexylene-dimethylene-terephthalate) resins, EMC resins (epoxy molding compound resins), silicone resins, and ceramics. In the present invention, unlike light source devices for illumination and back light applications that Include light source elements having a peak wavelength mainly around 450 nm, a light source element having a peak around 380 to 420 nm is used. Specifically in this case, the light energy from the mounted light emitting element is higher than that from a general light source device. Therefore, preferably, the material of the substrate/frame has high light durability. Specifically, the material is more preferably a PCT resin, an EMC resin, a silicone resin, or a ceramic and still more preferably an EMC resin, a silicone resin, or a ceramic.

An electrode pattern for electrically connecting the chip to frame electrodes is formed in the frame. Moreover, since there is also a need to increase the light emission efficiency of the light source device, the electrode pattern s often formed from silver (silver plating) having high visible light reflectance. Silver is lower in cost than gold and has higher visible light reflectance than gold. However, silver is more likely to be oxidized or blackened by light and heat. Therefore, when a higher priority is given to the reliability of the light source device than to its light emission efficiency, gold may be used to form the electrode pattern.

To bond the chip to the frame or substrate, die bonding is necessary.

A face-up type light emitting element has wire-bondable anode and cathode electrodes on an upper surface of a chip. Example of the material of a die bonding paste when the face-up type light emitting element is used include epoxy resins, transparent and semi-transparent silicone resins, white silicone resins, and silver pastes. The light transmittance of die bonding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is high, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes an LED chip having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are disposed on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

The present invention also provides a light source device including: at least one light emitting element of at least one type; at least one far-red phosphor that, when excited by output light from the at least one light emitting element, emits light having a peak in a wavelength range of 680 nm or more to less than 780 nm; at least one green phosphor; and at least one red phosphor, wherein the spectrum of light emitted from the light source device has the following characteristic A.

Characteristic A: The ratio of a minimum emission Intensity to a maximum emission intensity in a wavelength range of from 400 nm to 750 nm inclusive is 20% or more.

In this case, the light emitting element may have at least an emission peak in a wavelength range of 380 nm or more to less than 420 nm, and the light source device may further include at least one blue phosphor that is excited by the output light from the light emitting element. Preferably, the blue phosphor includes divalent europium-activated halophosphate described later, i.e., $(MXVIII)_{5-x31}Eu_{x31}(PO_4)_3$ (MXIX) (where MXVIII is at least one of Ca, Sr, and Ba; MXIX is at least one of F, Cl, and Br; and $0.1 \leq x31 \leq 1.5$). Preferably, the blue phosphor further includes, in addition to the divalent europium-activated halophosphate, another blue phosphor, i.e., a divalent europium-activated aluminum oxide phosphor (a divalent europium-activated halophosphate phosphor) represented by $(MXX)_{1-a32}Eu_{a32}MgAl_{10}O_{17}$ (where MXX is at least one of Sr and Da, and $0.005 \leq a32 \leq 0.2$). In particular, when the light emitting element has at least an emission peak only in a wavelength range of 380 nm or more to less than 420 nm, the selection of the blue phosphor is important.

Moreover, a plurality of light emitting elements having peaks at different emission wavelengths may be used in combination (at least one light emitting element having an emission peak in a wavelength range of 380 nm or more to less than 420 nm and at least one light emitting element having an emission peak in a wavelength range of 420 nm or more to less than 460 nm may be used). Alternatively, one light emitting element that emits light having different emission peaks may be used (at least one light emitting element having an emission peak in a wavelength range of 380 nm or more to less than 420 nm and an emission peak in a wavelength range of 420 nm or more to less than 460 nm may be used).

The present invention also provides a light emitting device and a sensing device each including the light source device of the present invention. The light emitting device of the present invention is intended to encompass light source devices for sensors, lighting systems, backlight devices, etc. The sensing device of the present invention intended to encompass spectroscopic systems, distance-measuring devices, etc.

In illumination applications, it is preferable to obtain an emission spectrum that is as close as possible to that of a standard light source, because high color rendering properties can be obtained. Therefore, as described above in the characteristic A, it is preferable that the emission intensities of all the wavelength components in the visible range are equal to or higher than a certain level. In sensing applications, in consideration of the possibility that the sensing ability varies with wavelength and the possibility that noise due to external light has an influence on the sensing sensitivity, it is preferable that the emission intensities of all the wavelength components in the visible range are equal to or higher than a certain level, as described above in the characteristic A.

Advantageous Effects of Invention

The present invention can provide a light source device that is capable of outputting an emission spectrum having sufficient intensity at all wavelengths in the visible range and is suitable for sensing and can also provide a light source device suitable for illumination with high color rendering properties.

DESCRIPTION OF EMBODIMENTS

Figure 1:
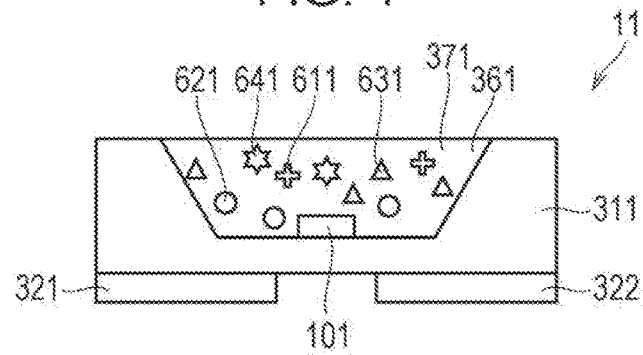
FIG. 1 is a cross-sectional view of a light source device 11 in embodiment 1 of the present invention.

Next, the present invention will be described with reference to the drawings. In the drawings in the present invention, the same reference numerals designate the same or corresponding parts. Relations between dimensions such as length, width, thickness, and depth in each drawing are appropriately changed for clarification and simplification of the drawing and do not represent actual dimensional relations.

Embodiment 1

FIG. 1 is a cross-sectional view of a light source device 11 in embodiment 1 of the present invention. In embodiment 1 of the invention, the light source device 11 includes at least one first light emitting element 101 having an emission peak in a wavelength range of 380 nm or more to less than 420 nm. Preferably, the first light emitting element 101 has an emission peak in a first wavelength range of 400 nm or more to less than 420 nm. Most light emitting elements have a half width of 20 nm or less, but this depends on the type of light emitting element. Generally, a phosphor that emits light when irradiated with light of 380 nm or more to less than 420 nm has an emission peak wavelength of at least about 430 nm, and its half width is 30 nm or more. Specifically, in view of the emission spectrum of the phosphor and the emission spectrum of the light emitting element, when the emission peak of the light emitting element is in a wavelength range of 380 nm or more to less than 420 nm, an emission component is present in the target wavelength range of 400 nm or more. When the emission peak of the light emitting element is in a wavelength range of 400 nm or more to less than 420 nm, an emission spectrum with more uniform spectral intensity can be easily obtained. Therefore, when the emission peak is in a wavelength range of 380 nm or more to less than 420 nm and more preferably in a wavelength range of 400 nm or more to less than 420 nm, a light source device having sufficient emission components in the target wavelength range of from 400 nm to 750 nm inclusive can be obtained.

In the first light emitting element 101, the peak wavelength of the output light is, for example, 405 nm. The first light emitting element 101 is a light emitting element and is preferably a light emitting diode. Therefore, at least part of the output light from the first light emitting element 101 constitutes part (e.g., a violet component) of the light (e.g., white light) from the light source device 11.

As shown in FIG. 1, in the light source device 11 in the present embodiment, one first light emitting element 101 is mounted on a frame 311. A phosphor-containing resin layer 371 is provided around the first light emitting element 101 so as to cover the first light emitting element 101. The phosphor-containing resin layer 371 contains a resin 361 and further contains a far-red phosphor 611, a red phosphor 621, a green phosphor 631, and a blue phosphor 641 that are dispersed or sedimented in the resin 361.

The frame 311 is formed from, for example, a white resin base material. Therefore, the frame 311 provided can be excellent in visible light reflecting characteristics, i.e., can have high light extraction efficiency.

Examples of the material of the frame for mounting the chip include PPA (polyphthalamide) resins, PCT (polycyclohexylene-dimethylene-terephthalate) resins, EMC resins (epoxy molding compound resins), silicone resins, and ceramics. In the present invention, unlike light source devices for illumination and back light applications that include light source elements having a peak wavelength mainly around 450 nm, a light source element having a peak around 380 to 420 nm is used. Specifically, in this case, the light energy from the mounted light emitting element is higher than that from a general light source device. Therefore, preferably, the material of the frame has high light durability. Specifically, the material is more preferably a PCT resin, an EMC resin, a silicone resin, or a ceramic and still more preferably an EMC resin, a silicone resin, or a ceramic.

An electrode pattern for electrically connecting the chip to frame electrodes is formed in the frame. Moreover, since there is also a need to increase the light emission efficiency of the light source device, the electrode pattern is often formed from silver (silver plating) having high visible light reflectance. Silver is lower in cost than gold and has higher visible light reflectance than gold. However, silver is more likely to be oxidized or blackened by light and heat. Therefore, when a higher priority is given to the reliability of the light source device than to its light emission efficiency, gold may be used to form the electrode pattern.

To bond the chip to the frame, die bonding is necessary.

A face-up type light emitting element has wire-bondable anode and cathode electrodes on an upper surface of a chip. Example of the material of a die bonding paste when the face-up type light emitting element is used include epoxy resins, transparent and semi-transparent silicone resins, whine silicone resins, and silver pastes. The light transmittance of die bonding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is high, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes an LED chip having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are disposed on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

Electrodes 321 and 322 are provided on the frame 311. Therefore, to supply electric power, the first light emitting element 101 mounted on the frame 311 is connected to the electrodes 321 and 322 through unillustrated through electrodes. However, it is not always necessary to use the through electrodes. For example, the electrodes 321 and 322 may be formed on side surfaces of the frame 311.

The first light emitting element 101 is electrically connected to the through electrodes. When the first light emitting element 101 is of the face-up type, i.e., of the type in which the anode and cathode are disposed on the upper surface of the chip, gold wires are used for connection. Alternatively, when the first light emitting element 101 is of the flip type, i.e., the type in which the anode and cathode are disposed on the lower surface, solder, a silver paste, or gold-tin eutectic bumps are used for connection. Alternatively, when the first light emitting element 101 is of the upper-lower electrode type, a gold wire is used for electrical connection of the electrode on the upper surface of the chip, and solder, a silver paste, or a gold-tin eutectic bump is used for electrical connection of the electrode on the lower surface of the chip. The frame structure selected must be changed according to the type of chip.

As described above, in the light source device 11 in the present embodiment, the phosphor-containing resin layer 371 containing, dispersed or sedimented therein, the far-red phosphor 611, the red phosphor 621, the green phosphor 631, and the blue phosphor 641 is disposed so as to cover the first light emitting element 101. In the phosphor-containing resin layer 371, the resin 361 in which the far-red phosphor 611, the red phosphor 621, the green phosphor 631, and the blue phosphor 641 are dispersed or sedimented is a transparent silicone resin.

The first light emitting element 101 and the phosphor-containing resin layer 371 are disposed on one surface of the frame 311 (hereinafter denoted as the "upper surface of the frame 311"). The phosphor-containing resin layer 371 seals the first light emitting element 101 and is disposed in a region on the upper surface of the frame 311, which region is surrounded by a wall of the frame.

The inner circumferential surface of the wall of the frame 311 may be perpendicular to the upper surface of the frame 311. It is, however, preferable that the inner circumferential surface of the wall of the frame is inclined with respect to the upper surface of the frame 311 such that the diameter of the opening increases from the upper surface of the frame 311 toward the upper surface of the phosphor-containing resin layer 371. This allows the light to be outputted efficiently.

The wall of the frame may not be provided. For example, when a highly thixotropic resin is used as the resin 361, the resin 361 can be prevented from flowing toward the circumferential edge of the upper surface of the frame 311 even when the wall of the frame is not provided. A substrate having a rectangular shape in plan view (e.g., a ceramic-made flat substrate) may be used as the frame 311 to form a surface-mounting type light source unit.

(Phosphor-Containing Resin Layer)

The phosphor-containing resin layer 371 contains the resin 361, the far-red phosphor 611, the red phosphor 621, the green phosphor 631, and the blue phosphor 641.

Preferably, the phosphor-containing resin layer 371 is formed by filling the region surrounded by the wall of the frame 311 with the resin 361, the far-red phosphor 611, the red phosphor 621, the green phosphor 631, and the blue phosphor 641 and then curing the resin 361. Preferably, the phosphor-containing resin layer 371 is disposed such that the first light emitting element 101 disposed in the region surrounded by the wall of the frame 311 is embedded in the phosphor-containing resin layer 371. Specifically, in the present embodiment, the first light emitting element 101 is sealed with the phosphor-containing resin layer 371 alone. In the present description, the phrase "sealed with the phosphor-containing resin layer 371 alone" means that a single resin is used for sealing.

The resin 361 used to form the phosphor-containing resin layer 371 is preferably a resin with high light transmittance and more preferably a resin that can transmit the output light from the first light emitting element 101, far-red light emitted from the far-red phosphor 611, red light emitted from the red phosphor 621, green light emitted from the green phosphor 631, and blue light emitted from the blue phosphor 641. No particular limitation is imposed on the resin 361, so long as it can be used as a sealing resin included in a resin-sealed light source device. Preferred examples of such a resin include dimethyl-based silicone resins, phenyl-based silicone resins, and epoxy resins.

In consideration of heat resistance, the resin 361 is more preferably a dimethyl-based silicone resin or a phenyl-based silicone resin.

The far-red phosphor 611 is preferably Cr-activated $Gd_3Ga_5O_{12}$, and the red phosphor 621 is preferably $Sr_xCa_{1-x}AlSiN_3:Eu^{2+}$. The green phosphor 631 is preferably divalent europium-activated β-SiAlON, and the blue phosphor 641 is preferably divalent europium-activated halosilicate. The far-red phosphor 611, the red phosphor 621, the green phosphor 631, and the blue phosphor 641 are not limited to the above phosphors and may be phosphors shown below. Preferably, the combination of the light emitting element and the phosphors is selected such that optimum conditions are obtained in view of the excitation characteristics of the phosphors.

The phosphor-containing resin layer 371 contains the far-red phosphor 611 and may further contain only one of the red phosphor 621, the green phosphor 631, and the blue phosphor 641. The far-red phosphor 611 used may include two or more far-red phosphors, and the red phosphor 621 used may include two or more red phosphors. The green phosphor 631 used may include two or more green phosphors, and the blue phosphor 641 used may include two or more blue phosphors. When the phosphor-containing resin layer 371 contains at least one far-red phosphor 611, at least one red phosphor 621, at least one green phosphor 631, and at least one blue phosphor 641, the light source device 11 can serve as a light source having the intended spectrum.

(Far-Red Phosphor)

The far-red phosphor 611 emits far-red light when excited by the output light from the first light emitting element 101 and is preferably, for example, the following (1) and particularly preferably Cr-activated $Gd_3Ga_5O_{12}$ ($Gd_3Ga_5O_{12}$:$Cr^{3+}$).

(1) A phosphor represented by $(Ln_{1-x}Cr_x)_3M_5O_{12}$ (where Ln is at least one element selected from Y, La, Gd, and Lu; M is at least one element selected from Al, Ga, and In; and x is a number satisfying $0.005 \leq x \leq 0.2$).

(Red Phosphor)

The red phosphor emits red light when excited by the output light from the first light emitting element 101. Preferred examples of the red phosphor include (11) to (15) described below. The red phosphor 621 used may be any one of the following (11) to (15) or a combination of two or more of the following (11) to (15).

(11) A phosphor represented by $(MI)_{1-x11}Eu_{x11}(MII)SiN_3$ (where MI is at least one of Mg, Ca, Sr, and Ba; MII is at least one of Al, Ga, in, Sc, Y, La, Gd, and Lu; and $0.005 \leq x11 \leq 0.2$) (a divalent europium-activated nitride phosphor).

(12) A phosphor represented by $(MIII)_{2-x12}Eu_{x12}Si_5N_8$ (where MIII is at least one of Mg, Ca, Sr, and Ba, and $0.005 \leq x12 \leq 0.2$) (a divalent europium-activated nitride phosphor).

(13) α-SiAlON represented by $Eu_f(MTV)_gSi_hAl_iO_jN_k$ (where MIV is at least one of Li, Na, K, Rb, Cs, Mg, Ca, Sr, Ba, Sc, Y, La, and Gd; $0.001 \leq f \leq 0.2$; $0.15 \leq f+g \leq 1.5$; $h+i=12$; and $j+k=12$) (a divalent europium-activated oxynitride phosphor).

(14) A phosphor represented by $(MV)_2((MVI)_{1-x14}Mn_{x14})F_6$ (where MV is at least one of Li, Na, K, Rb, and Cs; MVI is at least one of Ce, Si, Sn, Ti, and Zr; and $0.005 \leq x14 \leq 0.3$) (a tetravalent manganese-activated metal fluoride salt phosphor).

(15) A phosphor represented by $(MVII)_{2-x15}Eu_{x15}O_{3-y15}S_{y15}$ (MVII is at least one of Y, La, and Gd; $0.005 \leq x15 \leq 0.4$; and $0.0 \leq y15 \leq 2.0$) (a trivalent europium-activated sulfate phosphor).

(Green Phosphor)

The green phosphor 631 emits green light when excited by the output light from the first light emitting element 101. Preferred examples of the green phosphor 631 include (21) to (28) below. The green phosphor 631 used may be any one of the following (21) to (28) or a combination of two or more of the following (21) to (28).

(21) β-SiAlON represented by general formula $Eu_{a1}Si_{b1}Al_{c1}O_{d1}N_{e1}$ (where 0.001≤a1≤0.2; b1 and c1 satisfy b1+c1=12; and d1 and e1 satisfy d1+e1=16) (a divalent europium-activated oxynitride phosphor).

(22) A phosphor having a garnet crystal structure and represented by $(MVIII)_{3-x22}Ce_{x22}(MIX)_5O_{12}$ (where MVVIII is at least one of Lu, Y, La, and Gd; MIX is at least one of Al and Ga; and 0.005≤x22≤0.3) (a trivalent cerium-activated oxide phosphor).

(23) A phosphor represented by $(MX)_{2-x23}Eu_{x23}SiO_4$ (where MX is at least one of Mg, Ca, Sr, and Ba, and 0.005≤x23≤0.4) (a divalent europium-activated silicate phosphor).

(24) A phosphor represented by $(MXI)_{3-x23}Ce_{x24}(MXII)_2Si_3O_{12}$ (where MXI is at least one of Mg, Ca, Sr, and Ba; MXII is at least one of Li, Na, K, Cs, Rb, Mg, Ca, Ba, Al, Ga, In, Sc, Y, La, Gd, and Lu; and 0.005≤x24≤0.3) (a trivalent cerium-activated silicate phosphor).

(25) A phosphor represented by $(MXIII)_{3-x25}Ce_{x25}Si_6N_{11}$ (where MXIII is at least one of Lu, Y, La, and Gd, and 0.005≤x25≤0.2) (a trivalent cerium-activated nitride phosphor).

(26) A phosphor represented by $(MXIV)_{1-a26}Eu_{a26}Mg_{1-x26}Al_{10-y26}Mn_{x26+y26}O_{17}$ (where MXIV is at least one of Sr and Ba; 0.005≤a26≤0.2; and 0.005≤x26+y26≤0.2) (a divalent europium- and divalent manganese-activated aluminate phosphor).

(27) A phosphor represented by $(MXV)_{3-a25}Ce_{a25}Si_6O_{12}N_2$ (where MXV is at least one of Sr and Ba, and 0.005≤a27≤0.2) (a divalent europium- and divalent manganese-activated silicate phosphor).

(28) A phosphor represented by $(MXVI)_{1-a28}Eu_{a28}MXVII_2O_4$ (where MXVI is at least one of Ca, Sr, and Ba; MXVII is at least one of Al and Ga; and 0.005≤a28≤0.2) (a divalent europium-activated aluminate phosphor).
(Blue Phosphor)

The blue phosphor 641 emits blue light when excited by the first light emitting element 101. The blue phosphor 641 may be divalent europium-activated halophosphate shown in (31) below, divalent europium-activated aluminum oxide shown in (32) below, or trivalent cerium-activated nitride shown in (33) below. The blue phosphor 641 used may be any one of the following (31) to (33) or a combination of two or more of the following (31) to (33).

(31) A phosphor represented by $(MXVIII)_{5-x31}Eu_{x31}(PO_4)_3(MXIX)$ (where MXVIII is at least one of Ca, Sr, and Ba; MXIX is at least one of F, Cl, and Br; and 0.1≤x31≤1.5) (a divalent europium-activated halophosphate phosphor).

(32) A phosphor represented by $(MXX)_{1-a32}Eu_{a32}MgAl_{10}O_{17}$ (where MXX is at least one of Sr and Ba, and 0.005≤a32≤0.2) (a divalent europium-activated aluminum oxide phosphor).

(33) A phosphor represented by $(MXXI)_{1-x33}Ce_{x32}Si_3N_5$ (where MXXI is at least one of Lu, Y, La, and Gd, and 0.005≤x33≤0.2) (a trivalent cerium-activated nitride phosphor).
[Application to Lighting System, Backlight Device, Sensor Device, Etc.]

The light source device 11 has the optical characteristics described above. Therefore, the light source device 11 can be used as a light source of a light emitting device (examples of the light emitting device include light source devices for sensors, lighting systems, and backlight devices). The light emitting device in the present embodiment includes the light source device 11. Therefore, the light emitting device provided as, for example, a light source device for a sensor, a lighting system, or a backlight device can have the above-described optical characteristics. In the light source device for a sensor, the lighting system, and the backlight device in the present embodiment, structural components included in conventional light source devices for sensors, lighting systems, and backlight devices other than their light source devices may be used without any limitation.

Embodiment 2

Figure 2:
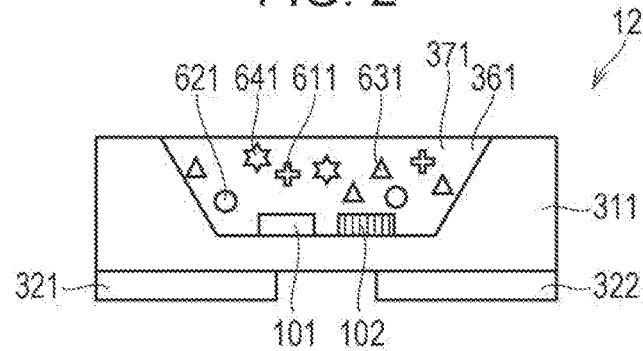
FIG. 2 is a cross-sectional view of a light source device 12 in embodiment 2 of the present invention.

FIG. 2 is a cross-sectional view of a light source device 12 in embodiment 2 of the present invention. In embodiment 2 of the invention, the light source device 12 includes at least one first light emitting element 101 having an emission peak in a wavelength range of 380 nm or more to less than 420 nm and at least one second light emitting element 102 having an emission peak in a wavelength range of 420 nm or more to less than 460 nm. In this case, even when a phosphor not easily excited by the output light from the first light emitting element 101 is used, the light emission efficiency of the phosphor can be maintained at a high level through the output light from the second light emitting element 102. In the light source device 12 provided, its light emission efficiency can be higher than that of the light source device 11 shown in FIG. 1. Therefore, a variety of emission spectrums can be obtained, and the design flexibility of the emission spectrum can be increased, so that the light source device 21 can have a desired emission spectrum more easily. Preferably, the first light emitting element 101 has an emission peak in a first wavelength range of 400 nm or more to less than 420 nm. Most light emitting elements have a half width of 20 nm or less, but this depends on the type of light emitting element. Generally, a phosphor that emits light when irradiated with light of 380 nm or more to less than 420 nm has an emission peak wavelength of at least about 430 nm, and its half width is 30 nm or more. Specifically, in view of the emission spectrum of the phosphor and the emission spectrum of the light emitting element, when the emission peak of the light emitting element is in a wavelength range of 380 nm or more to less than 420 nm, an emission component is present in the target wavelength range of 400 nm or more. When the emission peak of the light emitting element is in a wavelength range of 400 nm or more to less than 420 nm, an emission spectrum with more uniform spectral intensity can be easily obtained. Therefore, when the emission peak is in a wavelength range of 380 nm or more to less than 420 nm and more preferably in a wavelength range of 400 nm or more to less than 420 nm, a light source device having sufficient emission components in the target wavelength range of from 400 nm to 750 nm inclusive can be obtained.

In the first light emitting element 101, the peak wavelength of the output light is, for example, 405 nm. In the second light emitting element 102, the peak wavelength of the output light is, for example, 445 nm. Each of the first light emitting element 101 and the second light emitting element 102 is a light emitting element and is preferably a light emitting diode. Therefore, at least part of the output light from the first light emitting element 101 and at least part of the output light from the second light emitting element 102 constitute part (e.g., a violet component) of the light (e.g., white light) from the light source device 12.

The light source device 12 in the present embodiment includes a frame 311, the first light emitting element 101, the second light emitting element 102, and a resin layer 371 containing phosphors (hereinafter denoted simply as a "phosphor-containing resin layer"). The peak wavelength of the output light from the first light emitting element 101 differs from the peak wavelength of the output light from the second light emitting element 102.

As shown in FIG. 2, in the light source device 12 in the present embodiment, one first light emitting element 101 and one second light emitting element 102 are mounded on the frame 311. The phosphor-containing resin layer 371 is disposed around the first light emitting element 101 and the second light emitting element 102 so as to cover them. The phosphor-containing resin layer 371 contains a resin 361 and further contains a far-red phosphor 611, a red phosphor 621, a green phosphor 631, and a blue phosphor 641 that are dispersed or sedimented in the resin 361.

The frame 311 is formed from, for example, a white resin base material. Therefore, the frame 311 provided can be excellent in visible light reflecting characteristics, i.e., can have high light extraction efficiency.

Examples of the material of the frame for mounting the chips include PPA (polyphthalamide) resins, PCT (polycyclohexylene-dimethylene-terephthalate) resins, EMC resins (epoxy molding compound resins), silicone resins, and ceramics. In the present invention, unlike light source devices for illumination and back light applications that include light source elements having a peak wavelength mainly around 450 nm, a light source element having a peak around 380 to 420 nm is used. Specifically, in this case, the light energy from the mounted light emitting elements is higher than that from a general light source device. Therefore, preferably, the material of the frame has high light durability. Specifically, the material is more preferably a PCT resin, an EMC resin, a silicone resin, or a ceramic and still more preferably an EMC resin, a silicone resin, or a ceramic.

An electrode pattern for electrically connecting the chips to frame electrodes is formed in the frame. Moreover, since there is also a need to increase the light emission efficiency of the light source device, the electrode pattern is often formed from silver (silver plating) having high visible light reflectance. Silver is lower in cost than gold and has higher visible light reflectance than gold. However, silver is more likely to be oxidized or blackened by light and heat. Therefore, when a higher priority is given to the reliability of the light source device than to its light emission efficiency, gold may be used to form the electrode pattern.

To bond the chips to the frame, die bonding is necessary.

A face-up type light emitting element has wire-bondable anode and cathode electrodes on an upper surface of a chip. Example of the material of a die bonding paste when the face-up type light emitting element is used include epoxy resins, transparent and semi-transparent silicone resins, white silicone resins, and silver pastes. The light transmittance of die bonding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is high, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes an LED chip having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are disposed on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

Electrodes 321 and 322 are provided on the frame 311. Therefore, to supply electric power, the first light emitting element 101 and the second light emitting element 102 mounted on the frame 311 are connected to the electrodes 321 and 322 through unillustrated through electrodes. However, it is not always necessary to use the through electrodes. For example, the electrodes 321 and 322 may be formed on side surfaces of the frame 311.

The first light emitting element 101 and the second light emitting element 102 are electrically connected to the through electrodes. As described above, the structure of the frame selected and the method for connecting the chips to the electrodes must be changed according to the type of chip electrodes.

As described above, in the light source device 12 in the present embodiment, the phosphor-containing resin layer 371 containing, dispersed or sedimented therein, the far-red phosphor 611, the red phosphor 621, the green phosphor 631, and the blue phosphor 641 is disposed so as to cover the first light emitting element 101 and the second light emitting element 102. In the phosphor-containing resin layer 371, the resin 361 in which the far-red phosphor 611, the red phosphor 621, the green phosphor 631, and the blue phosphor 641 are dispersed or sedimented is a transparent silicone resin.

The first light emitting element 101, the second light emitting element 102, and the phosphor-containing resin layer 371 are disposed on the upper surface of the frame 311. The phosphor-containing resin layer 371 seals the first light emitting element 101 and the second light emitting element 102 and is disposed in a region on the upper surface of the frame 311, which region is surrounded by a wall of the frame.

The inner circumferential surface of the wall of the frame 311 may be perpendicular to the upper surface of the frame 311. It is, however, preferable that the inner circumferential surface of the wall of the frame is inclined with respect to the upper surface of the frame 311 such that the diameter of the opening increases from the upper surface of the frame 311 toward the upper surface of the phosphor-containing resin layer 371. This allows the light to be outputted efficiently.

The wall of the frame may not be provided. For example, when a highly thixotropic resin is used as the resin 361, the resin 361 can be prevented from flowing toward the circumferential edge of the upper surface of the frame 311 even when the wall of the frame is not provided. A substrate having a rectangular shape in plan view (e.g., a ceramic-made flat substrate) may be used as the frame 311 to form a surface-mounting type tight source unit.

(Phosphor-Containing Resin Layer)

The phosphor-containing resin layer 371 contains the resin 361, the far-red phosphor 611, the red phosphor 621, the green phosphor 631, and the blue phosphor 641. Preferably, the phosphor-containing resin layer 371 is formed by filling the region surrounded by the wall of the frame 311 with the resin 361, the far-red phosphor 611, the red phosphor 621, the green phosphor 631, and the blue phosphor 641 and then curing the resin 361. Preferably, the phosphor-containing resin layer 371 is disposed such that the first light emitting element 101 and the second light emitting element 102 disposed in the region surrounded by the wall of the frame 311 are embedded in the phosphor-containing resin layer 371. Specifically, in the present embodiment, the first light emitting element 101 and the second light emitting element 102 are sealed with the phosphor-containing resin layer 371 alone.

The resin 361 used to form the phosphor-containing resin layer 371 is preferably a resin with high light transmittance and more preferably a resin that can transmit the output light from the first light emitting element 101, the output light from the second light emitting element 102, far-red light emitted from the far-red phosphor 611, red light emitted from the red phosphor 621, green light emitted from the green phosphor 631, and blue light emitted from the blue phosphor 641. No particular limitation is imposed on the resin 361, long as it can be used as a sealing resin included in a resin-sealed light source device. Preferred examples of such a resin include dimethyl-based silicone resins, phenyl-based silicone resins, and epoxy resins.

The far-red phosphor 611 is preferably Cr-activated $Gd_3Ga_5O_{12}$, and the red phosphor 621 is preferably $Sr_xCa_{1-x}AlSiN_3:Eu^{2+}$. The green phosphor 631 is preferably divalent europium-activated β-SiAiON, and the blue phosphor 641 is preferably divalent europium-activated halosilicate. The far-red phosphor 611, the red phosphor 621, the green phosphor 631, and the blue phosphor 641 are not limited to the above phosphors and may be phosphors shown below. Preferably, the combination of the light emitting elements and the phosphors is selected such that optimum conditions are obtained in view of the excitation characteristics of the phosphors.

The phosphor-containing resin layer 371 contains the far-red phosphor 611 and may further contain only one of the red phosphor 621, the green phosphor 631, and the blue phosphor 641. The far-red phosphor 611 used may include two or more far-red phosphors, and the red phosphor 621 used may include two or more red phosphors. The green phosphor 631 used may include two or more green phosphors, and the blue phosphor 641 used may include two or more blue phosphors. When the phosphor-containing resin layer 371 contains at least one far-red phosphor 611, at least one red phosphor 621, at least one green phosphor 631, and at least one blue phosphor 641, the light source device 12 can serve as a light source having the intended spectrum.

(Far-Red Phosphor)

The far-red phosphor 611 emits far-red light when excited by the output light from the first light emitting element 101 or the output light from the second light emitting element 102 and is preferably, for example, (1) described above and particularly preferably Cr-activated $Gd_3Ga_5O_{12}$ ($Gd_3Ga_5O_{12}:Cr^{3+}$).

(Red Phosphor)

The red phosphor 621 emits red light when excited by the output light from the first light emitting element 101 or the output light from the second light emitting element 102, and, for example, (11) to (15) described above are preferred. The red phosphor 621 used may be any one of the above (11) to (15) or a combination of two or more of the above (11) to (15).

(Green Phosphor)

The green phosphor 631 emits green light when excited by the output light from the first light emitting element 101 or the output light from the second light emitting element 102, and, for example, (21) to (28) described above are preferred. The green phosphor 631 used may be any one of the above (21) to (28) or a combination of two or more of the above (21) to (28).

(Blue Phosphor)

The blue phosphor 641 emits blue light when excited by the first light emitting element 101 or the second light emitting element 102. The blue phosphor 641 may be divalent europium-activated halophosphate shown in (31) above, divalent europium-activated aluminum oxide shown in (32) above, or trivalent cerium-activated nitride shown in (33) above. The blue phosphor 641 used may be any one of the above (31) to (33) or a combination of two or more of the above (31) to (33).

[Application to Lighting System, Backlight Device, Sensor Device, Etc.]

The light source device 12 has the optical characteristics described above. Therefore, the light source device 12 can be used as a light source of a light emitting device (examples of the light emitting device include light source devices for sensors, lighting systems, and backlight devices). The light emitting device in the present embodiment includes the light source device 12. Therefore, the light emitting device provided as, for example, a light source device for a sensor, a lighting system, or a backlight device can have the above-described optical characteristics. In the light source device for a sensor, the lighting system, and the backlight device in the present embodiment, structural components included in conventional light source devices for sensors, lighting systems, and backlight devices other than their light source devices may be used without any limitation.

Embodiment 3

Figure 3:
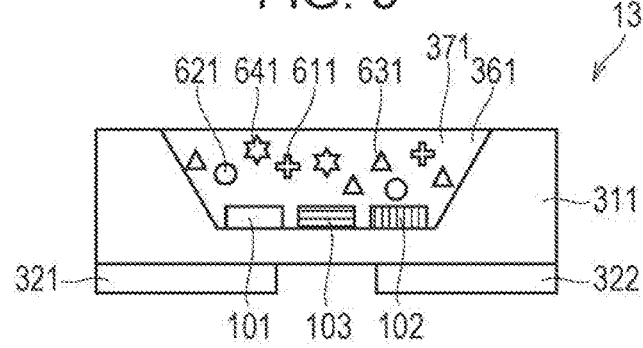
FIG. 3 is a cross-sectional view of a light source device 13 in embodiment 3 of the present invention.

FIG. 3 is a cross-sectional view of a light source device 13 in embodiment 3 of the present invention. In embodiment 3 of the present invention, the light source device 13 includes at least one first light emitting element 101 having an emission peak in a wavelength range of 380 nm or more to less than 420 nm, at least one second light emitting element 102 having an emission peak in a wavelength range of 420 nm or more to less than 460 nm, and at least one third light emitting element 103 having an emission peak in a wavelength range of 460 nm or more to less than 490 nm. In this case, even when a phosphor not easily excited by the output light from the first light emitting element 101 and the output light from the second light emitting element 102 is used, the light emission efficiency of the phosphor can be maintained at a high level through the output light from the third light emitting element 103. Alternatively, the output light from the third light emitting element 103 may not be used to excite a phosphor but may be used to contribute to the emission spectrum of the light source device 13. In the light source device 13 provided, its light emission efficiency can be higher than that of the light source device 12 shown in FIG. 2. Therefore, a variety of emission spectrums can be obtained, and the design flexibility of the emission spectrum can be increased, so that the light source device 13 can have a desired emission spectrum more easily. Preferably, the first light emitting element 101 has an emission peak in a first wavelength range of 400 nm or more to less than 420 nm. Most light emitting elements have a half width of 20 nm or less, but this depends on the type of light emitting element.

Generally, a phosphor that emits light when irradiated with light of 380 nm or more to less than 420 nm has an emission peak wavelength of at least about 430 nm, and its half width is 30 nm or more. Specifically, in view of the emission spectrum of the phosphor and the emission spectrum of the light emitting element, when the emission peak of the light emitting element is in a wavelength range of 380 nm or more to less than 420 nm, an emission component is present in the target wavelength range of 400 nm or more. When the emission peak of the light emitting element is in a wavelength range of 400 nm or more to less than 420 nm, an emission spectrum with more uniform spectral intensity can be easily obtained. Therefore, when the emission peak is in a wavelength range of 380 nm or more to less than 420 nm and more preferably in a wavelength range of 400 nm or more to less than 420 nm, a light source device having sufficient emission components in the target wavelength range of from 400 nm to 750 nm inclusive can be obtained.

The light source device 13 in the present embodiment includes a frame 311, the first light emitting element 101, the second light emitting element 102, the third light emitting element 103, and a resin layer 371 containing phosphors (hereinafter denoted simply as a "phosphor-containing resin layer"). The peak wavelength of the output light from the first light emitting element 101, the peak wavelength of the output light from the second light emitting element 102, and the peak wavelength of the output light from the third light emitting element 103 differ from each other.

As shown in FIG. 3, in the light source device 13 in the present embodiment, one first light emitting element 101, one second light emitting element 102, and one third light emitting element 103 are mounted on the frame 311. The phosphor-containing resin layer 371 is disposed around the first light emitting element 101, the second light emitting element 102, and the third light emitting element 103 so as to cover them. The phosphor-containing resin layer 371 contains a resin 361 and further contains a far-red phosphor 611, a red phosphor 621, a green phosphor 631, and a blue phosphor 641 that are dispersed or sedimented in the resin 361.

The frame 311 is formed from, for example, a white resin base material. Therefore, the frame 311 provided can be excellent in visible light reflecting characteristics, i.e., can have high light extraction efficiency.

Examples of the material of the frame for mounting the chips include PPA (polyphthalamide) resins, PCT (polycyclohexylene-dimethylene-terephthalate) resins, EMC resins (epoxy molding compound resins), silicone resins, and ceramics. In the present invention, unlike light source devices for illumination and back light applications that include light source elements having a peak wavelength mainly around 450 nm, a light source element having a peak around 380 to 420 nm is used. Specifically, in this case, the light energy from the mounted light emitting elements is higher than that from a general light source device. Therefore, preferably, the material of the frame has high light durability. Specifically, the material is more preferably a PCT resin, an EMS resin, a silicone resin, or a ceramic and still more preferably an EMS resin, a silicone resin, or a ceramic.

An electrode pattern for electrically connecting the chips to frame electrodes is formed in the frame. Moreover, since there is also a need to increase the light emission efficiency of the light source device, the electrode pattern is often formed from silver (silver plating) having high visible light reflectance. Silver is lower in cost than gold and has higher visible light reflectance than gold. However, silver is more likely to be oxidized or blackened by light and heat. Therefore, when a higher priority is given to the reliability of the light source device than to its light emission efficiency, gold may be used to form the electrode pattern.

To bond the chips to the frame, die bonding is necessary.

A face-up type light emitting element has wire-bondable anode and cathode electrodes on an upper surface of a chip. Example of the material of a die bonding paste when the face-up type light emitting element is used include epoxy resins, transparent and semi-transparent silicone resins, white silicone resins, and silver pastes. The light transmittance of die bonding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is high, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes an LED chip having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are disposed on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

Electrodes 321 and 322 are provided on the frame 311. Therefore, to supply electric power, the first light emitting element 101, the second light emitting element 102, and the third light emitting element 103 mounted on the frame 311 are connected to the electrodes 321 and 322 through unillustrated through electrodes. However, it is not always necessary to use the through electrodes. For example, the electrodes 321 and 322 may be formed on side surfaces of the frame 311.

The first light emitting element 101, the second light emitting element 102, and the third light emitting element 103 are electrically connected to the through electrodes. As described above, the structure of the frame selected and the method for connecting the chips to the electrodes must be changed according to the type of chip electrodes.

As described above, in the light source device 13 in the present embodiment, the phosphor-containing resin layer 371 containing, dispersed or sedimented therein, the far-red phosphor 611, the red phosphor 621, the green phosphor 631, and the blue phosphor 641 is disposed so as to cover the first light emitting element 101, the second light emitting element 102, and the third light emitting element 103. In the phosphor-containing resin layer 371, the resin 361 in which the far-red phosphor 611, the red phosphor 621, the green phosphor 631, and the blue phosphor 641 are dispersed or sedimented is a transparent silicone resin.

The first light emitting element 101, the second light emitting element 102, the third light emitting element 103, and the phosphor-containing resin layer 371 are disposed on the upper surface of the frame 311. The phosphor-containing resin layer 371 seals the first light emitting element 101, the second light emitting element 102, and the third light emitting element 103 and is disposed in a region on the upper surface of the frame 311, which region is surrounded by a wall of the frame.

The inner circumferential surface of the wall of the frame 311 may be perpendicular to the upper surface of the frame 311. It is, however, preferable that the inner circumferential surface of the wall of the frame is inclined with respect to the upper surface of the frame 311 such that the diameter of the opening increases from the upper surface of the frame 311 toward the upper surface of the first phosphor-containing resin layer 371. This allows the light to be outputted efficiently.

The wall of the frame may not be provided. For example, when a highly thixotropic resin is used as the resin 361, the resin 361 can be prevented from flowing toward the circumferential edge of the upper surface of the frame 311 even when the wall of the frame is not provided. A substrate having a rectangular shape in plan view (e.g., a ceramic-made flat substrate) may be used as the frame 311 to form a surface-mounting type light source unit.

(Phosphor-Containing Resin Layer)

The phosphor-containing resin layer 371 contains the resin 361, the far-red phosphor 611, the red phosphor 621, the green phosphor 631, and the blue phosphor 641. Preferably, the phosphor-containing resin layer 371 is formed by filling the region surrounded by the wall of the frame 311 with the resin 361, the far-red phosphor 611, the red phosphor 621, the green phosphor 631, and the blue phosphor 641 and then curing the resin 361. Preferably, the phosphor-containing resin layer 371 is disposed such that the first light emitting element 101, the second light emitting element 102, and the third light emitting element 103 disposed in the region surrounded by the wall of the frame 311 are embedded in the phosphor-containing resin layer 371. Specifically, in the present embodiment, the first light emitting element 101, the second light emitting element 102, and the third light emitting element 103 are sealed with the phosphor-containing resin layer 371 alone.

The resin 361 used to form the phosphor-containing resin layer 371 is preferably a resin with high light transmittance and more preferably a resin that can transmit the output light from the first light emitting element 101, the output light from the second light emitting element 102, the output light from the third light emitting element 103, far-red light emitted from the far-red phosphor 611, red light emitted from the red phosphor 621, green light emitted from the green phosphor 631, and blue light emitted from the blue phosphor 641. No particular limitation is imposed on the resin 361, long as it can be used as a sealing resin included in a resin-sealed light source device. Preferred examples of such a resin include dimethyl-based silicone resins, phenyl-based silicone resins, and epoxy resins.

To improve the orientational characteristics of the emission spectrum of the light source device, the phosphor-containing sealing resin layer may contain a diffusing agent. This is also the case for other embodiments.

The far-red phosphor 611 is preferably Cr-activated $Gd_3Ga_5O_{12}$, and the red phosphor 621 is preferably $Sr_xCa_{1-x}AlSiN_3:Eu^{2+}$. The green phosphor 631 is preferably divalent europium-activated β-SiAlON, and the blue phosphor 641 is preferably divalent europium-activated halosilicate. The far-red phosphor 611, the red phosphor 621, the green phosphor 631, and the blue phosphor 641 are not limited to the above phosphors and may be phosphors shown below. Preferably, the combination of the light emitting elements and the phosphors is selected such that optimum conditions are obtained in view of the excitation characteristics of the phosphors.

The phosphor-containing resin layer 371 contains the far-red phosphor 611 and may further contain only one of the red phosphor 621, the green phosphor 631, and the blue phosphor 641. The far-red phosphor 611 used may include two or more far-red phosphors, and the red phosphor 621 used may include two or more red phosphors. The green phosphor 631 used may include two or more green phosphors, and the blue phosphor 641 used may include two or more blue phosphors. When the phosphor-containing resin layer 371 contains at least one far-red phosphor 611, at least one red phosphor 621, at least one green phosphor 631, and at least one blue phosphor 641, the light source device 13 can serve as a light source having the intended spectrum.

(Far-Red Phosphor)

The far-red phosphor 611 emits far-red light when excited by the output light from the first light emitting element 101, the output light from the second light emitting element 102, or the output light from the third light emitting element 103 and is preferably, for example, (1) described above and particularly preferably Cr-activated $Gd_3Ga_5O_{12}$ ($Gd_3Ga_5O_{12}:Cr^{3+}$).

(Red Phosphor)

The red phosphor 621 emits red light when excited by the output light from the first light emitting element 101, the output light from the second light emitting element 102, or the output light from the third light emitting element 103, and, for example, (11) to (15) described above are preferred. The red phosphor 621 used may be any one of the above (11) to (15) or a combination of two or more of the above (11) to (15).

(Green Phosphor)

The green phosphor 631 emits green light when excited by the output light from the first light emitting element 101, the output light from the second light emitting element 102, or the output light from the third light emitting element 103, and, for example, (21) to (28) described above are preferred. The green phosphor 631 used may be any one of the above (21) to (28) or a combination of two or more of the above (21) to (28).

(Blue Phosphor)

The blue phosphor 641 emits blue light when excited by the first light emitting element 101, the second light emitting element 102, or the third light emitting element 103. The blue phosphor 641 may be divalent europium-activated halophosphate shown in (31) above, divalent europium-activated aluminum oxide shown in (32) above, or trivalent cerium-activated nitride shown in (33) above. The blue phosphor 641 used may be any one of the above (31) to (33) or a combination of two or more of the above (31) to (33).

[Application to Lighting System, Backlight Device, Sensor Device, Etc.]

The light source device 13 has the optical characteristics described above. Therefore, the light source device 13 can be used as a light source of a light emitting device (examples of the light emitting device include light source devices for sensors, lighting systems, and backlight devices). The light emitting device in the present embodiment includes the light source device 13. Therefore, the light emitting device provided as, for example, a light source device for a sensor, a lighting system, or a backlight device can have the above-described optical characteristics. In the light source device for a sensor, the lighting system, and the backlight device in the present embodiment, structural components included in conventional light source devices for sensors, lighting systems, and backlight devices other than their light source devices may be used without any limitation.

Embodiment 4

Figure 4:
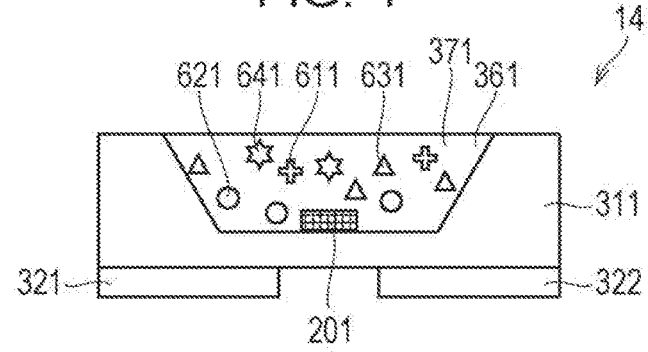
FIG. 4 is a cross-sectional view of a light source device 14 in embodiment 4 of the present invention.

FIG. 4 is a cross-sectional view of a light source device 14 in embodiment 4 of the present invention. In embodiment 4 of the present invention, the light source device 14 includes at least one fourth light emitting element 201 having an emission peak in a wavelength range of 380 nm or more to less than 420 nm and an emission peak in a wavelength range of 420 nm or more to less than 460 nm. In the fourth light emitting element 201, the wavelength range of 380 nm or more to less than 420 nm is preferably a wavelength range of 400 nm or more to less than 420 nm. Most light emitting elements have a half width of 20 nm or less, but this depends on the type of light emitting element. Generally, a phosphor that emits light when irradiated with light of 380 nm or more to less than 420 nm has an emission peak wavelength of at least about 430 nm, and its half width is 30 nm or more. Specifically, in view of the emission spectrum of the phosphor and the emission spectrum of the light emitting element, when the emission peak of the light emitting element is in a wavelength range of 380 nm or more to less than 420 nm, an emission component is present in the target wavelength range of 400 nm or more. When the emission peak of the light emitting element is in a wavelength range of 400 nm or more to less than 420 nm, an emission spectrum with more uniform spectral intensity can be easily obtained. Therefore, when the emission peak is in a wavelength range of 380 nm or more to less than 420 nm and more preferably in a wavelength range of 400 nm or more to less than 420 nm, a light source device having sufficient emission components in the target wavelength range of from 400 nm to 750 nm inclusive can be obtained.

The light source device 14 in the present embodiment includes a frame 311, the fourth light emitting element 201, and a resin layer 371 containing phosphors (hereinafter denoted simply as a "phosphor-containing resin layer"). In the fourth light emitting element 201, the peak wavelengths of the output light differ from each other.

As shown in FIG. 4, in the light source device 14 in the present embodiment, one fourth light emitting element 201 is mounted on a frame 311. A phosphor-containing resin layer 371 is provided around the fourth light emitting element 201 so as to cover the fourth light emitting element 201. The phosphor-containing resin layer 371 contains a resin 361 and further contains a far-red phosphor 611, a red phosphor 621, a green phosphor 631, and a blue phosphor 641 that are dispersed or sedimented in the resin 361.

The frame 311 is formed from, for example, a white resin base material. Therefore, the frame 311 provided can be excellent in visible light reflecting characteristics, i.e., can have high light extraction efficiency.

Examples of the material of the frame for mounting the chip include PPA (polyphthalamide) resins, PCT (polycyclohexylene-dimethylene-terephthalate) resins, EMC resins (epoxy molding compound resins), silicone resins, and ceramics. In the present invention, unlike light source devices for illumination and back light applications that Include light source elements having a peak wavelength mainly around 450 nm, a light source element having a peak around 380 to 420 nm is used. Specifically, in this case, the light energy from the mounted light emitting element is higher than that from a general light source device. Therefore, preferably, the material of the frame has high light durability. Specifically, the material is more preferably a PCT resin, an EMC resin, a silicone resin, or a ceramic and still more preferably an FMC resin, a silicone resin, or a ceramic.

An electrode pattern for electrically connecting the chip to frame electrodes is formed in the frame. Moreover, since there is also a need to increase the light emission efficiency of the light source device, the electrode pattern is often formed from silver (silver plating) having high visible light reflectance. Silver is lower in cost than gold and has higher visible light reflectance than gold. However, silver is more likely to be oxidized or blackened by light and heat. Therefore, when a higher priority is given to the reliability of the light source device than to its light emission efficiency, gold may be used to form the electrode pattern.

To bond the chip to the frame, die bonding is necessary.

A face-up type light emitting element has wire-bondable anode and cathode electrodes on an upper surface of a chip. Example of the material of a die bonding paste when the face-up type light emitting element is used include epoxy resins, transparent and semi-transparent silicone resins, white silicone resins, and silver pastes. The light transmittance of die bonding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is high, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes an LED chip having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are disposed on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

Electrodes 321 and 322 are provided on the frame 311. Therefore, to supply electric power, the fourth light emitting element 201 mounted on the frame 311 is connected to the electrodes 321 and 322 through unillustrated through electrodes. However, it is not always necessary to use the through electrodes. For example, the electrodes 321 and 322 may be formed on side surfaces of the frame 311.

The fourth light emitting element 201 is electrically connected to the through electrodes. As described above, the structure of the frame selected and the method for connecting the chip to the electrodes must be changed according to the type of chip electrodes.

As described above, in the light source device 14 in the present embodiment, the phosphor-containing resin layer 371 containing, dispersed or sedimented therein, the far-red phosphor 611, the red phosphor 621, the green phosphor 631, and the blue phosphor 641 is disposed so as to cover the fourth light emitting element 201. In the phosphor-containing resin layer 371, the resin 361 in which the far-red phosphor 611, the red phosphor 621, the green phosphor 631, and the blue phosphor 641 are dispersed or sedimented is a transparent silicone resin.

The fourth light emitting element 201 and the phosphor-containing resin layer 371 are disposed on the upper surface of the frame 311. The phosphor-containing resin layer 371 seals the fourth light emitting element 201 and is disposed in a region on the upper surface of the frame 311, which region is surrounded by a wall of the frame.

The inner circumferential surface of the wall of the frame 311 may be perpendicular to the upper surface of the frame 311. It is, however, preferable that the inner circumferential surface of the wall of the frame is inclined with respect to the upper surface of the frame 311 such that the diameter of the opening increases from the upper surface of the frame 311 toward the upper surface of the phosphor-containing resin layer 371. This allows the light to be outputted efficiently.

The wall of the frame may not be provided. For example, when a highly thixotropic resin is used as the resin 361, the resin 361 can be prevented from flowing toward the circumferential edge of the upper surface of the frame 311 even when the wall of the frame is not provided. A substrate having a rectangular shape in plan view (e.g., a ceramic-made flat substrate) may be used as the frame 311 to form a surface-mounting type light source unit.

(Phosphor-Containing Resin Layer)

The phosphor-containing resin layer 371 contains the resin 361, the far-red phosphor 611, the red phosphor 621, the green phosphor 631, and the blue phosphor 641. Preferably, the phosphor-containing resin layer 371 is formed by filling the region surrounded by the wall of the frame 311 with the resin 361, the far-red phosphor 611, the red phosphor 621, the green phosphor 631, and the blue phosphor 641 and then curing the resin 361. Preferably, the phosphor-containing resin layer 371 is disposed such that the fourth light emitting element 201 disposed in the region surrounded by the wall of the frame 311 is embedded in the phosphor-containing resin layer 371. Specifically, in the present embodiment, the fourth light emitting element 201 is sealed with the phosphor-containing resin layer 371 alone.

The resin 361 used to form the phosphor-containing resin layer 371 is preferably a resin with high light transmittance and is more preferably a resin that can transmit the output light from the fourth light emitting element 201, far-red light emitted from the far-red phosphor 611, red light emitted from the red phosphor 621, green light emitted from the green phosphor 631, and blue light emitted from the blue phosphor 641. No particular limitation is imposed on the resin 361, so long as it can be used as a sealing resin included in a resin-sealed light source device. Preferred examples of such a resin include dimethyl-based silicone resins, phenyl-based silicone resins, and epoxy resins.

The far-red phosphor 611 is preferably Cr-activated $Gd_3Ga_5O_{12}$, and the red phosphor 621 is preferably $Sr_xCa_{1-x}AlSiN_3:Eu^{2+}$. The green phosphor 631 is preferably divalent europium-activated β-SiAlON, and the blue phosphor 641 is preferably divalent europium-activated halosilicate. The far-red phosphor 611, the red phosphor 621, the green phosphor 631, and the blue phosphor 641 are not limited to the above phosphors and may be phosphors shown below. Preferably, the combination of the light emitting element and the phosphors is selected such that optimum conditions are obtained in view of the excitation characteristics of the phosphors.

The phosphor-containing resin layer 371 contains the far-red phosphor 611 and may further contain only one of the red phosphor 621, the green phosphor 631, and the blue phosphor 641. The far-red phosphor 611 used may include two or more far-red phosphors, and the red phosphor 621 used may include two or more red phosphors. The green phosphor 631 used may include two or more green phosphors, and the blue phosphor 641 used may include two or more blue phosphors. When the phosphor-containing resin layer 371 contains at least one far-red phosphor 611, at least one red phosphor 621, at least one green phosphor 631, and at least one blue phosphor 641, the light source device 14 can serve as a light source having the intended spectrum.

(Far-Red Phosphor)

The far-red phosphor 611 emits far-red light when excited by the output light from the fourth light emitting element 201 and is preferably, for example, (1) described above and particularly preferably Cr-activated $Gd_3Ga_5O_{12}$ ($Gd_3Ga_5O_{12}:Cr^{3+}$).

(Red Phosphor)

The red phosphor 621 emits red light when excited by the output light from the fourth light emitting element 201, and, for example, (11) to (15) described above are preferred. The red phosphor 621 used may be any one of the above (11) to (15) or a combination of two or more of the above (11) to (15).

(Green Phosphor)

The green phosphor 631 emits green light when excited by the output light from the fourth light emitting element 201, and, for example, (21) to (28) described above are preferred. The green phosphor 631 used may be any one of the above (21) to (28) or a combination of two or more of the above (21) to (28).

(Blue Phosphor)

The blue phosphor 641 emits blue light when excited by the fourth light emitting element 201. The blue phosphor 641 may be divalent europium-activated halophosphate shown in (31) above, divalent europium-activated aluminum oxide shown in (32) above, or trivalent cerium-activated nitrate shown in (33) above. The blue phosphor 641 used may be any one of the above (31) to (33) or a combination of two or more of the above (31) to (33).

[Another Form of Light Source Device]

The light source device 14 may have the following structure.

In addition to the fourth light emitting element 201, the first light emitting element 101, the second light emitting element 102, and the third light emitting element 103 described above may be used. The light emitted from these light emitting elements may be used to contribute to the emission spectrum of the light source device 14. Therefore, a variety of emission spectrums can be obtained. Specifically, when the first light emitting element 101, the second light emitting element 102, and the third light emitting element 103 are mounted, the design flexibility of the emission spectrum can be increased, so that the light source device 14 can have a desired emission spectrum more easily.

[Application to Lighting System, Backlight Device, Sensor Device, Etc.]

The light source device 14 has the optical characteristics described above. Therefore, the light source device 14 can be used as a light source of a light emitting device (examples of the light emitting device include light source devices for sensors, lighting systems, and backlight devices). The light emitting device in the present embodiment includes the light source device 14. Therefore, the light emitting device provided as, for example, a light source device for a sensor, a lighting system, or a back tight device can have the above-described optical characteristics. In the light source device for a sensor, the lighting system, and the backlight device in the present embodiment, structural components included in conventional light source devices for sensors, lighting systems, and backlight devices other than their light source devices may be used without any limitation.

Embodiment 5

Figure 5:
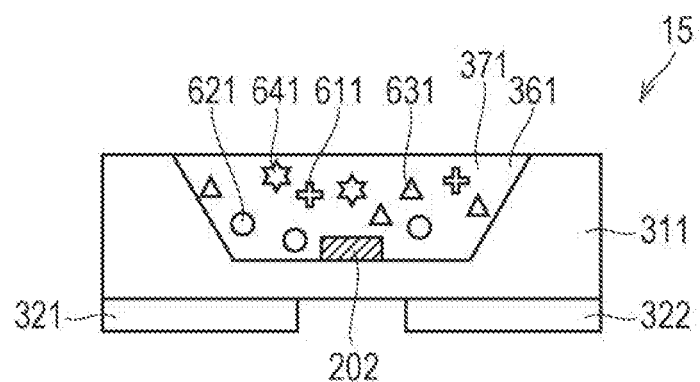
FIG. 5 is a cross-sectional view of a light source device 15 in embodiment 5 of the present invention.

FIG. 5 is a cross-sectional view of a light source device 15 in embodiment 5 of the present invention. In embodiment 5 of the present invention, the light source device 15 includes at least one fifth light emitting element 202 having an emission peak in a wavelength range of 380 nm or more to less than 420 nm and an emission peak in a wavelength range of 460 nm or more to less than 490 nm. In the fifth light emitting element 202, the wavelength range of 380 nm or more to less than 420 nm is preferably a wavelength range of 400 nm or more to less than 420 nm. Most light emitting elements have a half width of 20 nm or less, but this depends on the type of light emitting element. Generally, a phosphor that emits light when irradiated with light of 380 nm or more to less than 420 nm has an emission peak wavelength of at least about 430 nm, and its half width is 30 nm or more. Specifically, in view of the emission spectrum of the phosphor and the emission spectrum of the light emitting element, when the emission peak of the light emitting element is in a wavelength range of 380 nm or more to less than 420 nm, an emission component is present in the target wavelength range of 400 nm or more. When the emission peak of the light emitting element is in a wavelength range of 400 nm or more to less than 420 nm, an emission spectrum with more uniform spectral intensity can be easily obtained. Therefore, when the emission peak is in a wavelength range of 380 nm or more to less than 420 nm and more preferably in a wavelength range of 400 nm or more to less than 420 nm, a light source device having sufficient emission components in the target wavelength range of from 400 nm to 750 nm inclusive can be obtained.

The light source device 15 in the present embodiment includes a frame 311, the fifth light emitting element 202, and a resin layer 371 containing phosphors (hereinafter denoted simply as a "phosphor-containing resin layer"). In the fifth light emitting element 202, the peak wavelengths of the output light differ from each other.

As shown in FIG. 5, in the light source device 15 in the present embodiment, one second light emitting element 202 is mounted on the frame 311. A phosphor-containing resin layer 371 is provided around the fifth light emitting element 202 so as to cover the fifth light emitting element 202. The phosphor-containing resin layer 371 contains a resin 361 and further contains a far-red phosphor 611, a red phosphor 621, a green phosphor 631, and a blue phosphor 641 that are dispersed or sedimented in the resin 361.

The frame 311 is formed from, for example, a white resin base material. Therefore, the frame 311 provided can be excellent in visible light reflecting characteristics, i.e., can have high light extraction efficiency.

Examples of the material of the frame for mounting the chip include PPA (polyphthalamide) resins, PCT (polycyclohexylene-dimethylene-terephthalate) resins, EMC resins (epoxy molding compound resins), silicone resins, and ceramics. In the present invention, unlike light source devices for illumination and back light applications that include light source elements having a peak wavelength mainly around 450 nm, a light source element having a peak around 380 to 420 nm is used. Specifically, in this case, the light energy from the mounted light emitting element is higher than that from a general light source device. Therefore, preferably, the material of the frame has high light durability. Specifically, the material is more preferably a PCT resin, an EMC resin, a silicone resin, or a ceramic and still more preferably an EMC resin, a silicone resin, or a ceramic.

An electrode pattern for electrically connecting the chip to frame electrodes is formed in the frame. Moreover, since there is also a need to increase the light emission efficiency of the light source device, the electrode pattern is often formed from silver (silver plating) having high visible light reflectance. Silver is lower in cost than gold and has higher visible light reflectance than gold. However, silver is more likely to be oxidized or blackened by light and heat. Therefore, when a higher priority is given to the reliability of the light source device than to its light emission efficiency, gold may be used to form the electrode pattern.

To bond the chip to the frame, die bonding is necessary.

A face-up type light emitting element has wire-bondable anode and cathode electrodes on an upper surface of a chip. Example of the material of a die bonding paste when the face-up type light emitting element is used include epoxy resins, transparent and semi-transparent silicone resins, white silicone resins, and silver pastes. The light transmittance of die bonding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is high, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes an LED chip having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are disposed on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

Electrodes 321 and 322 are provided on the frame 311. Therefore, to supply electric power, the fifth light emitting element 202 mounted on the frame 311 is connected to the electrodes 321 and 322 through unillustrated through electrodes. However, it is not always necessary to use the through electrodes. For example, the electrodes 321 and 322 may be formed on side surfaces of the frame 311.

The fifth light emitting element 202 is electrically connected to the through electrodes. As described above, the structure of the frame selected and the method for connecting the chip to the electrodes must be changed according to the type of chip electrodes.

As described above, in the light source device 15 in the present embodiment, the phosphor-containing resin layer 371 containing, dispersed or sedimented therein, the far-red phosphor 611, the red phosphor 621, the green phosphor 631, and the blue phosphor 641 is disposed so as to cover the fifth light emitting element 202. In the phosphor-containing resin layer 371, the resin 361 in which the far-red phosphor 611, the red phosphor 621, the green phosphor 631, and the blue phosphor 641 are dispersed or sedimented is a transparent silicone resin.

The fifth light emitting element 202 and the phosphor-containing resin layer 371 are disposed on the upper surface of the frame 311. The phosphor-containing resin layer 371 seals the fifth light emitting element 202 and is disposed in a region on the upper surface of the frame 311, which region is surrounded by a wall of the frame.

The inner circumferential surface of the wall of the frame 311 may be perpendicular to the upper surface of the frame 311. It is, however, preferable that the inner circumferential surface of the wall of the frame is inclined with respect to the upper surface of the frame 311 such that the diameter of the opening increases from the upper surface of the frame 311 toward the upper surface of the phosphor-containing resin layer 371. This allows the light to be outputted efficiently.

The wall of the frame may not be provided. For example, when a highly thixotropic resin is used as the resin 361, the resin 361 can be prevented from flowing toward the circumferential edge of the upper surface of the frame 311 even when the wall of the frame is not provided. A substrate having a rectangular shape in plan view (e.g., a ceramic-made flat substrate) may be used as the frame 311 to form a surface-mounting type light source unit.

(Phosphor-Containing Resin Layer)

The phosphor-containing resin layer 371 contains the resin 361, the far-red phosphor 611, the red phosphor 621, the green phosphor 631, and the blue phosphor 641. Preferably, the phosphor-containing resin layer 371 is formed by filling the region surrounded by the wall of the frame 311 with the resin 361, the far-red phosphor 611, the red phosphor 621, the green phosphor 631, and the blue phosphor 641 and then curing the resin 361. Preferably, the phosphor-containing resin layer 371 is disposed such that the fifth light emitting element 202 disposed in the region surrounded by the wall of the frame 311 is embedded in the phosphor-containing resin layer 371. Specifically, in the present embodiment, the fifth light emitting element 202 is sealed with the phosphor-containing resin layer 371 alone.

The resin 361 contained in the phosphor-containing resin layer 371 is preferably a resin with high light transmittance and is more preferably a resin that can transmit the output light from the fifth light emitting element 202, far-red light emitted from the far-red phosphor 611, red light emitted from the red phosphor 621, green light emitted from the green phosphor 631, and blue light emitted from the blue phosphor 641. No particular limitation is imposed on the resin 361, so long as it can be used as a sealing resin included in a resin-sealed light source device. Preferred examples of such a resin include dimethyl-based silicone resins, phenyl-based silicone resins, and epoxy resins.

The far-red phosphor 611 is preferably Cr-activated $Gd_3Ga_5O_{12}$, and the red phosphor 621 is preferably $Sr_xCa_{1-x}AlSiN_3:Eu^{2+}$. The green phosphor 631 is preferably divalent europium-activated β-SiAlON, and the blue phosphor 641 is preferably divalent europium-activated halophosphoric acid. The far-red phosphor 611, the red phosphor 621, the green phosphor 631, and the blue phosphor 641 are not limited to the above phosphors and may be phosphors shown below. Preferably, the combination of the light emitting element and the phosphors is selected such that optimum conditions are obtained in view of the excitation characteristics of the phosphors.

The phosphor-containing resin layer 371 contains the far-red phosphor 611 and may further contain only one of the red phosphor 621, the green phosphor 631, and the blue phosphor 641. The far-red phosphor 611 used may include two or more far-red phosphors, and the red phosphor 621 used may include two or more red phosphors. The green phosphor 631 used may include two or more green phosphors, and the blue phosphor 641 used may include two or more blue phosphors. When the phosphor-containing resin layer 371 contains at least one far-red phosphor 611, at least one red phosphor 621, at least one green phosphor 631, and at least one blue phosphor 641, the light source device 15 can serve as a light source having the intended spectrum.

(Far-Red Phosphor)

The far-red phosphor 611 emits far-red light when excited by the output light from the fifth light emitting element 202 and is preferably, for example, (1) described above and particularly preferably Cr-activated $Gd_3Ga_5O_{12}$ ($Gd_3Ga_5O_{12}:Cr^{3+}$).

(Red Phosphor)

The red phosphor 621 emits red light when excited by the output light from the fifth light emitting element 202, and, for example, (11) to (15) described above are preferred. The red phosphor 621 used may be any one of the above (11) to (15) or a combination of two or more of the above (11) to (15).

(Green Phosphor)

The green phosphor 631 emits green light when excited by the output light from the fifth light emitting element 202, and, for example, (21) to (28) described above are preferred. The green phosphor 631 used may be any one of the above (21) to (28) or a combination of two or more of the above (21) to (28).

(Blue Phosphor)

The blue phosphor 641 emits blue light when excited by the fifth light emitting element 202. The blue phosphor 641 may be divalent europium-activated halophosphate shown in (31) above, divalent europium-activated aluminum oxide shown in (32) above, or trivalent cerium-activated nitride shown in (33) above. The blue phosphor 641 used may be any one of the above (31) to (33) or a combination of two or more of the above (31) to (33).

[Another Form of Light Source Device]

The light source device 15 may have the following structure.

In addition to the fifth light emitting element 202, the second light emitting element 102 described above may be used. The second light emitting element 102 has an emission peak in a wavelength range of 420 nm or more to less than 460 nm. Therefore, the combination of the light emitting elements can be selected from a wider range, and the phosphors can be selected from a wider range. More specifically, even when a resin containing a phosphor not easily excited by the output light from toe fifth light emitting element 202 is used, the light emission efficiency of the phosphor can be maintained at a high level through the output light from the second light emitting element 102. Therefore, the light emission efficiency of the light source device 15 can be further improved. Moreover, the light emitted from the second light emitting element 102 can be used to contribute to the emission spectrum of the light source device 15. Therefore, a variety of emission spectrums can be obtained. Specifically, when the second light emitting element 102 is mounted, the design flexibility of the emission spectrum can be increased, so that the light source device 15 can have a desired emission spectrum more easily.

[Application No Lighting System, Backlight Device, Sensor Device, Etc.]

The light source device 15 has the optical characteristics described above. Therefore, the light source device 15 can be used as a light source of a light emitting device (examples of the light emitting device include light source devices for sensors, lighting systems, and backlight devices). The light emitting device in the present embodiment includes the light source device 15. Therefore, the light emitting device provided as, for example, a light source device for a sensor, a lighting system, or a backlight device can have the above-described optical characteristics. In the light source device for a sensor, the lighting system, and the backlight device in the present embodiment, structural components included in conventional light source devices for sensors, lighting systems, and backlight devices other than their light source devices may be used without any limitation.

Embodiment 6

Figure 6:
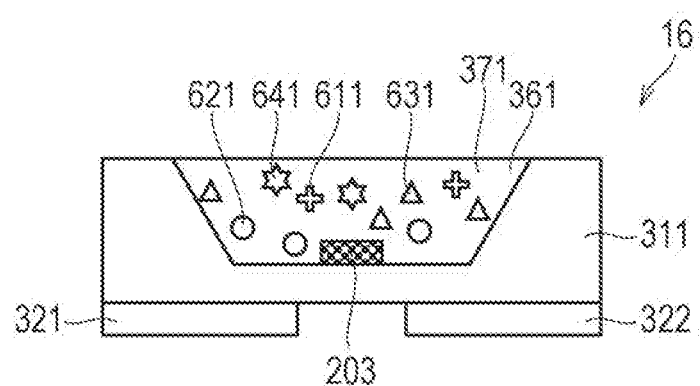
FIG. 6 is a cross-sectional view of a light source device 16 in embodiment 6 of the present invention.

FIG. 6 is a cross-sectional view of a light source device 16 in embodiment 6 of the present invention. In embodiment 6 of the present invention, the light source device 16 includes at least one sixth light emitting element 203 having an emission peak in a wavelength range of 380 nm or more to less than 420 nm, an emission peak in a wavelength range of 420 nm or more to less than 460 nm, and an emission peak in a wavelength range of 460 nm or more to less than 490 nm. In the sixth light emitting element 203, the wavelength range of 380 nm or more to less than 420 nm is preferably a wavelength range of 400 nm or more to less than 420 nm. Most light emitting elements have a half width of 20 nm or less, but this depends on the type of light emitting element. Generally, a phosphor that emits light when irradiated with light of 380 nm or more to less than 420 nm has an emission peak wavelength of at least about 430 nm, and its half width is 30 nm or more. Specifically, in view of the emission spectrum of the phosphor and the emission spectrum of the light emitting element, when the emission peak of the light emitting element is in a wavelength range of 380 nm or more to less than 420 nm, an emission component is present in the target wavelength range of 400 nm or more. When the emission peak of the light emitting element is in a wavelength range of 400 nm or more to less than 420 nm, an emission spectrum with more uniform spectral intensity can be easily obtained. Therefore, when the emission peak is in a wavelength range of 380 nm or more to less than 420 nm and more preferably in a wavelength range of 400 nm or more to less than 420 nm, a light source device having sufficient emission components in the target wavelength range of from 400 nm to 750 nm inclusive can be obtained.

The light source device 16 in the present embodiment includes a frame 311, the sixth light emitting element 203, and a resin layer 371 containing phosphors (hereinafter denoted simply as a "phosphor-containing resin layer"). In the sixth light emitting element 203, the peak wavelengths of the output light differ from each other.

As shown in FIG. 6, in the light source device 16 in the present embodiment, one sixth light emitting element 203 is mounted on the frame 311. A phosphor-containing resin layer 371 is provided around the sixth light emitting element 203 so as to cover the sixth light emitting element 203. The phosphor-containing resin layer 371 contains a resin 361 and further contains a far-red phosphor 611, a red phosphor 621, a green phosphor 631, and a blue phosphor 641 that are dispersed or sedimented in the resin 361.

The frame 311 is formed from, for example, a white resin base material. Therefore, the frame 311 provided can be excellent in visible light reflecting characteristics, i.e., can have high light extraction efficiency.

Examples of the material of the frame for mounting the chip include PPA (polyphthalamide) resins, PCT (polycyclohexylene-dimethylene-terephthalate) resins, EMC resins (epoxy molding compound resins), silicone resins, and ceramics. In the present invention, unlike light source devices for illumination and back light applications that include light source elements having a peak wavelength mainly around 450 nm, a light source element having a peak around 380 to 420 nm is used. Specifically, in this case, the light energy from the mounted light emitting element is higher than that from a general light source device. Therefore, preferably, the material of the frame has high light durability. Specifically, the material is more preferably a PCT resin, an EMC resin, a silicone resin, or a ceramic and still more preferably an EMC resin, a silicone resin, or a ceramic.

An electrode pattern for electrically connecting the chip to frame electrodes is formed in the frame. Moreover, since there is also a need to increase the light emission efficiency of the light source device, the electrode pattern is often formed from silver (silver plating) having high visible light reflectance. Silver is lower in cost than gold and has higher visible light reflectance than gold. However, silver is more likely to be oxidized or blackened by light and heat. Therefore, when a higher priority is given to the reliability of the light source device than to its light emission efficiency, gold may be used to form the electrode pattern.

To bond the chip to the frame, die bonding is necessary.

A face-up type light emitting element has wire-bondable anode and cathode electrodes on an upper surface of a chip. Example of the material of a die bonding paste when the face-up type light emitting element is used include epoxy resins, transparent and semi transparent silicone resins, white silicone resins, and silver pastes. The light transmittance of die bonding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is nigh, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes an LED chip having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are disposed on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

Electrodes 321 and 322 are provided on the frame 311. Therefore, to supply electric power, the sixth light emitting element 203 mounted on the frame 311 is connected to the electrodes 321 and 322 through unillustrated through electrodes. However, it is not always necessary to use the through electrodes. For example, the electrodes 321 and 322 may be formed on side surfaces of the frame 311.

The sixth light emitting element 203 is electrically connected to the through electrodes. As described above, the structure of the frame selected and the method for connecting the chip to the electrodes must be changed according to the type of chip electrodes.

As described above, in the light source device 16 in the present embodiment, the phosphor-containing resin layer 371 containing, dispersed or sedimented therein, the far-red phosphor 611, the red phosphor 621, the green phosphor 631, and the blue phosphor 641 is disposed so as to cover the sixth light emitting element 203. In the phosphor-containing resin layer 371, the resin 361 in which the far-red phosphor 611, the red phosphor 621, the green phosphor 631, and the blue phosphor 641 are dispersed or sedimented is a transparent silicone resin.

The sixth light emitting element 203 and the phosphor-containing resin layer 371 are disposed on the upper surface of the frame 311. The phosphor-containing resin layer 371 seals the sixth light emitting element 203 and is disposed in a region on the upper surface of the frame 311, which region is surrounded by a wall of the frame.

The inner circumferential surface of the wall of the frame 311 may be perpendicular to the upper surface of the frame 311. It is, however, preferable that the inner circumferential surface of the wall of the frame is inclined with respect to the upper surface of the frame 311 such that the diameter of the opening increases from the upper surface of the frame 311 toward the upper surface of the phosphor-containing resin layer 371. This allows the light to be outputted efficiently.

The wall of the frame may not be provided. For example, when a highly thixotropic resin is used as the resin 361, the resin 361 can be prevented from flowing toward the circumferential edge of the upper surface of the frame 311 even when the wall of the frame is not provided. A substrate having a rectangular shape in plan view (e.g., a ceramic-made flat substrate) may be used as the frame 311 to form a surface-mounting type light source unit.

(Phosphor-Containing Resin Layer)

The phosphor-containing resin layer 371 contains the resin 361, the far-red phosphor 611, the red phosphor 621, the green phosphor 631, and the blue phosphor 641. Preferably, the phosphor-containing resin layer 371 is formed by filling the region surrounded by the wall of the frame 311 with the resin 361, the far-red phosphor 611, the red phosphor 621, the green phosphor 631, and the blue phosphor 641 and then curing the resin 361. Preferably, the phosphor-containing resin layer 371 is disposed such that the sixth light emitting element 203 disposed in the region surrounded by the wall of the frame 311 is embedded in the phosphor-containing resin layer 371. Specifically, in the present embodiment, the sixth light emitting element 203 is sealed with the phosphor-containing resin layer 371 alone.

The resin 361 contained in the phosphor-containing resin layer 371 is preferably a resin with high light transmittance and is more preferably a resin that can transmit the output light from the sixth light emitting element 203, far-red light emitted from the far-red phosphor 611, red light emitted from the red phosphor 621, green light emitted from the green phosphor 631, and blue light emitted from the blue phosphor 641. No particular limitation is imposed on the resin 361, so long as it can be used as a sealing resin included in a resin-sealed light source device. Preferred examples of such a resin include dimethyl-based silicone resins, phenyl-based silicone resins, and epoxy resins.

The far-red phosphor 611 is preferably Cr-activated $Gd_3Ga_5O_{12}$, and the red phosphor 621 is preferably $Sr_xCa_{1-x}AlSiN_3:Eu^{2+}$. The green phosphor 631 is preferably divalent europium-activated β-SiAlON, and the blue phosphor 641 is preferably divalent europium-activated halophosphoric acid. The far-red phosphor 611, the red phosphor 621, the green phosphor 631, and the blue phosphor 641 are not limited to the above phosphors and may be phosphors shown below. Preferably, the combination of the light emitting element and the phosphors is selected such that optimum conditions are obtained in view of the excitation characteristics of the phosphors.

The phosphor-containing resin layer 371 contains the far-red phosphor 611 and may further contain only one of the red phosphor 621, the green phosphor 631, and the blue phosphor 641. The far-red phosphor 611 used may include two or more far-red phosphors, and the red phosphor 621 used may Include two or more red phosphors. The green phosphor 631 used may include two or more green phosphors, and the blue phosphor 641 used may include two or more blue phosphors. When the phosphor-containing resin layer 371 contains at least one far-red phosphor 611, at least one red phosphor 621, at least one green phosphor 631, and at least one blue phosphor 641, the light source device 16 can serve as a light source having the intended spectrum.

(Far-Red Phosphor)

The far-red phosphor 611 emits far-red light when excited by the output light from the sixth light emitting element 203 and is preferably, for example, (1) described above and particularly preferably Cr-activated $Gd_3Ga_5O_{12}$ ($Gd_3Ga_5O_{12}:Cr^{3+}$).

(Red Phosphor)

The red phosphor 621 emits red light when excited by the output light from the sixth light emitting element 203, and, for example, (11) to (15) described above are preferred. The red phosphor 621 used may be any one of the above (11) to (15) or a combination of two or more of the above (11) to (15).

(Green Phosphor)

The green phosphor 631 emits green light when excited by the output light from the sixth light emitting element 203, and, for example, (21) to (28) described above are preferred. The green phosphor 631 used may be any one of the above (21) to (28) or a combination of two or more of the above (21) to (28).

(Blue Phosphor)

The blue phosphor 641 emits blue light when excited by the sixth light emitting element 203. The blue phosphor 641 may be divalent europium-activated halophosphate shown in (31) above, divalent europium-activated aluminum oxide shown in (32) above, or trivalent cerium-activated nitride shown in (33) above. The blue phosphor 641 used may be any one of the above (31) to (33) or a combination of two or more of the above (31) to (33).

[Application to Lighting System, Backlight Device, Sensor Device, Etc.]

The light source device 16 has the optical characteristics described above. Therefore, the light source device 16 can be used as a light source of a light emitting device (examples of the light emitting device include light source devices for sensors, lighting systems, and backlight devices). The light emitting device in the present embodiment includes the light source device 16. Therefore, the light emitting device provided as, for example, light source device for a sensor, a lighting system, or a backlight device can have the above-described optical characteristics. In the light source device for a sensor, the lighting system, and the backlight device in the present embodiment, structural components included in conventional light source devices for sensors, lighting systems, and backlight devices other than their light source devices may be used without any limitation.

Embodiment 7

Figure 7:
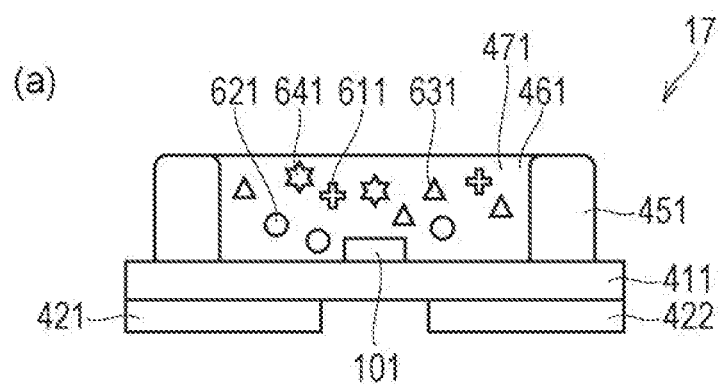
FIG. 7(a) is a cross-sectional view of a light source device 17 in embodiment 7 of the present invention.
FIG. 7(b) is a cross-sectional view of a light source device 17' in a modification of embodiment 7 of the present invention.
Figure 7:
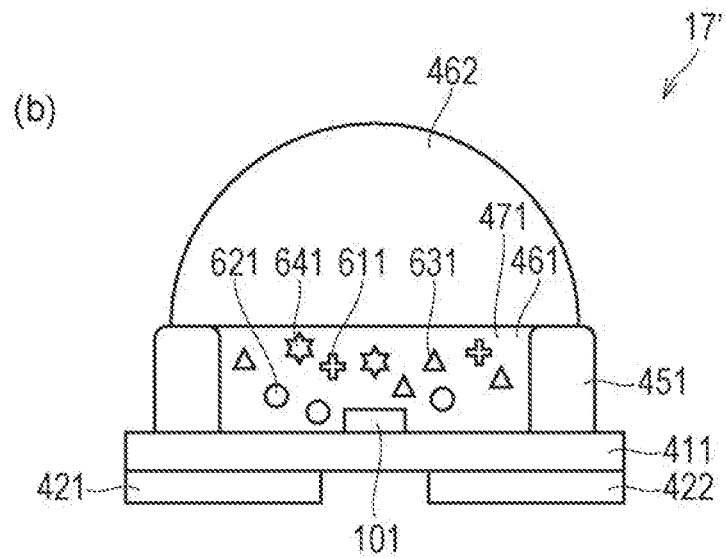

FIG. 7(*a*) is a cross-sectional view of a light source device 17 in embodiment 7 of the present invention. In embodiment 7 of the invention, the light source device 17 includes at least one first light emitting element 101 having an emission peak in a wavelength range of 380 nm or more to less than 420 nm. Preferably, the first light emitting element 101 has an emission peak in a first wavelength range of 400 nm or more to less than 420 nm. Most light emitting elements have a half width of 20 nm or less, but this depends on the type of light emitting element. Generally, a phosphor that emits light when irradiated with light of 380 nm or more to less than 420 nm has an emission peak wavelength of at least about 430 nm, and its half width is 30 nm or more. Specifically, in view of the emission spectrum of the phosphor and the emission spectrum of the light emitting element, when the emission peak of the light emitting element is in a wavelength range of 380 nm or more to less than 420 nm, an emission component is present in the target wavelength range of 400 nm or more. When the emission peak of the light emitting element is in a wavelength range of 400 nm or more to less than 420 nm, an emission spectrum with more uniform spectral intensity can be easily obtained. Therefore, when the emission peak is in a wavelength range of 380 nm or more to less than 420 nm and more preferably in a wavelength range of 400 nm or more to less than 420 nm, a light source device having sufficient emission components in the target wavelength range of from 400 nm to 750 nm inclusive can be obtained.

As shown in FIG. 7(*a*), in the light source device 17 in the present embodiment, one first light emitting element 101 is mounted on a substrate 411. A resin dam 451 is formed around the first light emitting element 101. A phosphor-containing resin layer 471 is provided on the inner side of the resin dam 451 so as to cover the first light emitting element 101. The phosphor-containing resin layer 471 contains a resin 461 and further contains a far-red phosphor 611, a red phosphor 621, a green phosphor 631, and a blue phosphor 641 that are dispersed or sedimented in the resin 461.

Examples of the material of the substrate for mounting the chip include PPA (polyphthalamide) resins, PCT (polycyclohexylene-dimethylene-terephthalate) resins, EMC resins (epoxy molding compound resins), silicone resins, and ceramics. In the present invention, unlike light source devices for illumination and back light applications that include light source elements having a peak wavelength mainly around 450 nm, a light source element having a peak around 380 to 420 nm is used. Specifically, in this case, the light energy from the mounted light emitting element is higher than that from a general light source device. Therefore, preferably, the material of the substrate has high light durability. Specifically, the material is more preferably a PCT resin, an EMS resin, a silicone resin, or a ceramic and still more preferably an EMS resin, a silicone resin, or a ceramic.

To bond the chip to the substrate, die bonding is necessary.

A face-up type light emitting element has wire-bondable anode and cathode electrodes on an upper surface of a chip. Example of the material of a die bonding paste when the face-up type light emitting element is used include epoxy resins, transparent and semi-transparent silicone resins, white silicone resins, and silver pastes. The light transmittance of die bonding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is high, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes an LED chip having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are V on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

The substrate 411 is formed from, for example, a ceramic. Therefore, the substrate 411 provided can be excellent in visible light reflecting characteristics, i.e., can have high light extraction efficiency. The substrate 411 provided can have good heat dissipation properties, as well as the excellent light extraction efficiency.

Electrodes 421 and 422 are provided on the substrate 411. Therefore, to supply electric power, the first light emitting element 101 mounted on the substrate 411 is connected to the electrodes 421 and 422 through unillustrated through electrodes. However, it is not always necessary to use the through electrodes. For example, the electrodes 421 and 422 may be formed on the upper surface or side surfaces of the substrate 411.

The first light emitting element 101 is electrically connected to the through electrodes. As described above, the structure of the frame selected and the method for connecting the chip to the electrodes must be changed according to the type of chip electrodes.

As described above, in the light source device 17 in the present embodiment, the phosphor-containing resin layer 471 containing, dispersed or sedimented therein, the far-red phosphor 611, the red phosphor 621, the green phosphor 631, and the blue phosphor 641 is disposed so as to cover the first light emitting element 101. In the phosphor-containing resin layer 471, the resin 461 in which the far-red phosphor 611, the red phosphor 621, the green phosphor 631, and the blue phosphor 641 are dispersed or sedimented is a transparent silicone resin.

The first light emitting element 101 and the phosphor-containing resin layer 471 are disposed on one surface of the substrate 411 (hereinafter denoted as the "upper surface of the substrate 411"). The phosphor-containing resin layer 471 seals the first light emitting element 101 and is disposed in a region on the upper surface of the substrate 411, which region is surrounded by a wall surface of the resin dam 451 formed on the upper surface of the substrate 411.

The inner circumferential surface of the resin dam 451 on the substrate 411 may be perpendicular to the upper surface of the substrate 411. It is, however, preferable that the inner circumferential surface of the wall of the resin dam 451 is inclined with respect to the upper surface of the substrate 411 such that the diameter of the opening increases from the upper surface of the substrate 411 toward the upper surface of the phosphor-containing resin layer 471. This allows the light to be outputted efficiently.

The resin dam 451 may not be provided. For example, when a highly thixotropic resin is used as the resin 461, the resin 461 can be prevented from flowing toward the circumferential edge of the upper surface of the substrate 411 even when the resin dam 451 is not provided.

(Phosphor-Containing Resin Layer)

The phosphor-containing resin layer 471 contains the resin 461, the far-red phosphor 611, the red phosphor 621, the green phosphor 631, and the blue phosphor 641. Preferably, the phosphor-containing resin layer 471 is formed by filling the region surrounded by the wall of the substrate 411 with the resin 461, the far-red phosphor 611, the red phosphor 621, the green phosphor 631, and the blue phosphor 641 and then curing the resin 461. Preferably, the phosphor-containing resin layer 471 is disposed such that the first light emitting element 101 disposed in the region surrounded by the wall of the substrate 411 is embedded in the phosphor-containing resin layer 471. Specifically, in the present embodiment, the first light emitting element 101 is sealed with the phosphor-containing resin layer 471 alone. In the present description, the phrase "sealed with the phosphor-containing resin layer 471 alone" means that a single resin is used for sealing.

The resin 461 contained in the phosphor-containing resin layer 471 is preferably a resin with high light transmittance and more preferably a resin that can transmit the output light from the first light emitting element 101, far-red light emitted from the far-red phosphor 611, red light emitted from the red phosphor 621, green light emitted from the green phosphor 631, and blue light emitted from the blue phosphor 641. No particular limitation is imposed on the resin 461, so long as it can be used as a sealing resin included in a resin-sealed light source device. Preferred examples of such a resin include dimethyl-based silicone resins, phenyl-based silicone resins, and epoxy resins.

FIG. 7(*b*) shows a cross-sectional view of a light source device 17' in a modification in the seventh embodiment. As shown in the modification in FIG. 7(*b*), the light source device in the seventh embodiment may include a lens-shaped transparent resin layer 462 that is convex in a direction away from the substrate 411 and is disposed so as to cover the phosphor-containing resin layer 471. The light source device 17' shown in the example in FIG. 7(*b*) has a package in which the first light emitting element 101 on the substrate 411 is doubly sealed with the phosphor-containing resin layer 471 and the transparent resin layer 462. The transparent resin layer 462 can be suitably formed from, for example, a dimethyl-based silicone resin, a phenyl-based silicone resin, or an epoxy resin. To improve the orientational characteristics of the emission spectrum of the light source device, the phosphor-containing sealing resin layer 471 may contain a diffusing agent as described above, and the transparent resin layer 462 may also contain a diffusing agent.

The far-red phosphor 611 is preferably Cr-activated $Gd_3Ga_5O_{12}$, and the red phosphor 621 is preferably $Sr_xCa_{1-x}AlSiN_3:Eu^{2+}$. The green phosphor 631 is preferably divalent europium-activated β-SiAlON, and the blue phosphor 641 is preferably divalent europium-activated halosilicate. The far-red phosphor 611, the red phosphor 621, the green phosphor 631, and the blue phosphor 641 are not limited to the above phosphors and may be phosphors shown below. Preferably, the combination of the light emitting element and the phosphors is selected such that optimum conditions are obtained in view of the excitation characteristics of the phosphors.

The phosphor-containing resin layer 471 contains the far-red phosphor 611 and may further contain only one of the red phosphor 621, the green phosphor 631, and the blue phosphor 641. The far-red phosphor 611 used may include two or more far-red phosphors, and the red phosphor 621 used may include two or more red phosphors. The green phosphor 631 used may include two or more green phosphors, and the blue phosphor 641 used may include two or more blue phosphors. When the phosphor-containing resin layer 471 contains at least one far-red phosphor 611, at least one red phosphor 621, at least one green phosphor 631, and at least one blue phosphor 641, the light source device 17, 17' can serve as a light source having the intended spectrum.

(Far-Red Phosphor)

The far-red phosphor 611 emits far-red light when excited by the output light from the first light emitting element 101 and is preferably (1) described above and particularly preferably Cr-activated $Gd_2Ga_5O_{12}$ ($Gd_3Ga_5O_{12}:Cr^{3+}$).

(Red Phosphor)

The red phosphor 621 emits red light when excited by the output light from the first light emitting element 101, and, for example, (11) to (15) described above are preferred. The red phosphor 621 used may be any one of the above (11) to (15) or a combination of two or more of the above (11) to (15).

(Green Phosphor)

The green phosphor 631 emits green light when excited by the output light from the first light emitting element 101, and, for example, (21) to (28) described above are preferred.

The green phosphor 631 used may be any one of the above (21) to (28) or a combination of two or more of the above (21) to (28).

(Blue Phosphor)

The blue phosphor 641 emits blue light when excited by the first light emitting element 101. The blue phosphor 641 may be divalent europium-activated halophosphate shown in (31) above, divalent europium-activated aluminum oxide shown in (32) above, or trivalent cerium-activated nitride shown in (33) above. The blue phosphor 641 used may be any one of the above (31) to (33) or a combination of two or more of the above (31) to (33).

[Another Form of Light Source Device]

The light source device 17, 17' may have the following structure.

In addition to the first light emitting element 101, the second light emitting element 102 and/or the third light emitting element 103 described above may be used. The second light emitting element 102 has an emission peak in a wavelength range of 420 nm or more to less than 460 nm, and the third light emitting element 103 has an emission peak in a wavelength range of 460 nm or more to less than 490 nm. Therefore, the combination of the light emitting elements can be selected from a wider range, and the phosphors can be selected from a wider range.

More specifically, even when a resin containing a phosphor not easily excited by the output light from the first light emitting element 101 is used, the light emission efficiency of the phosphor can be maintained at a high level through the output light from the second light emitting element 102 and/or the output light from the third light emitting element 103. The light emission efficiency of the light source device 17, 17' can thereby be further improved. Therefore, a variety of emission spectrums can be obtained. Since the design flexibility of the emission spectrum can be increased, the light source device 17, 17' can have a desired emission spectrum more easily.

[Application to Lighting System, Backlight Device, Sensor Device, Etc.]

The light source device 17, 17' has the optical characteristics described above. Therefore, the light source device 17, 17' can be used as a light source of a light emitting device (examples of the light emitting device include light source devices for sensors, lighting systems, and backlight devices). The light emitting device in the present embodiment includes the light source device 17, 17'. Therefore, the light emitting device provided as, for example, a light source device for a sensor, a lighting system, or a backlight device can have the above-described optical characteristics. In the light source device for a sensor, the lighting system, and the backlight device in the present embodiment, structural components included in conventional light source devices for sensors, lighting systems, and backlight devices other than their light source devices may be used without any limitation.

Embodiment 8: Single Chip, Single Wavelength COB

Figure 8:
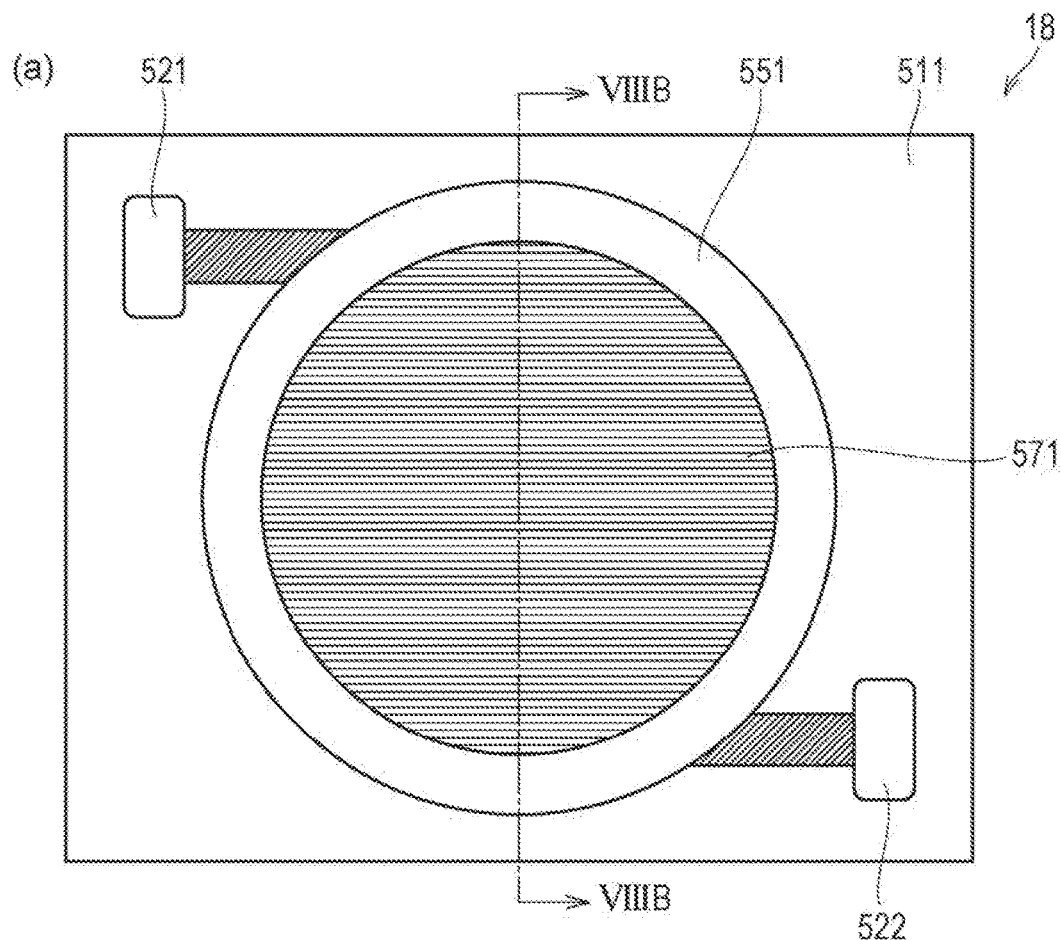
FIG. 8(a) is a plan view of a light source device 18 in embodiment 8 of the present invention.
FIG. 8(b) is a cross-sectional view of the light source device 18 shown in FIG. 8(a), the cross-sectional view being taken along cutting plane line VIIIB-VIIIB.
Figure 8:
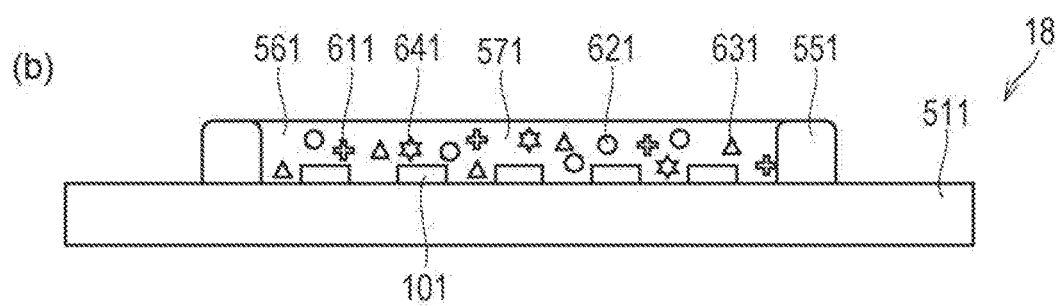

FIG. 8(a) is a plan view of a light source device 18 in embodiment 8 of the present invention, and FIG. 8(b) is a cross-sectional view of the light source device 18 shown in FIG. 8(a), the cross-sectional view being taken along cutting plane line VIIIB-VIIIB. The light source device 18 in the present embodiment includes a substrate 511, first light emitting elements 101, and a resin layer 571 containing phosphors (hereinafter denoted simply as a "phosphor-containing resin layer").

Examples of the material of the substrate for mounting the chips include PPA (polyphthalamide) resins, PCT (polycyclohexylene-dimethylene-terephthalate) resins, EMC resins (epoxy molding compound resins), silicone resins, and ceramics. In the present invention, unlike light source devices for illumination and back light applications that include light source elements having a peak wavelength mainly around 450 nm, light source elements having a peak around 380 to 420 nm are used. Specifically, in this case, the light energy from the mounted light emitting elements is higher than that from a general light source device. Therefore, preferably, the material of the substrate has high light durability. Specifically, the material is more preferably a PCT resin, an EMC resin, a silicone resin, or a ceramic and still more preferably an EMC resin, a silicone resin, or a ceramic.

To bond the chips to the substrate, die bonding is necessary.

A face-up type light emitting element has wire-bondable anode and cathode electrodes on an upper surface of a chip. Example of the material of a die bonding paste when the face-up type light emitting element is used include epoxy resins, transparent and semi transparent silicone resins, white silicone resins, and silver pastes. The light transmittance of die bonding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is nigh, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes LED chips having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are disposed on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

The substrate 511 is preferably a ceramic substrate and has preferably a rectangular shape in plan view. The first light emitting elements 101, a dam ring (resin-made frame) 551, and a phosphor-containing resin layer 571 are disposed on one surface of the substrate 511 (hereinafter denoted are the "upper surface of the substrate 511"). Moreover, a first electrode 1 and 521 and a second electrode 1 and 522 are disposed on the upper surface.

The dam ring 551 is a member that defines the outer shape of the phosphor-containing resin layer 571 (the phosphor-containing resin layer 571 contains a resin 561, a far-red phosphor 611, a red phosphor 621, a green phosphor 631, and a blue phosphor 641) and serves as a dam (a damming member) for preventing leakage to the outside of the dam ring 551 when the phosphor-containing resin layer 571 is formed.

The first electrode 1 and 521 and the second electrode 1 and 522 are disposed on the upper surface of the substrate 511 in positions outside the dam ring 551. The first electrode 1 and 521 and the second electrode 1 and 522 are disposed preferably at corners on the upper surface of the substrate 511 and more preferably on a diagonal line of the substrate 511. A surface of the first electrode 1 and 521 and a surface of the second electrode 1 and 522 are exposed, so that the first electrode 1 and 521 and the second electrode 1 and 522 can be connected to external terminals. Specifically, one of the first electrode 1 and 521 and the second electrode 1 and 522 serves as an anode electrode for external connection, and the other one serves as a cathode electrode for external connection.

(Light Emitting Elements)
(Arrangement Pattern and Connection Mode)

The first light emitting elements 101 are preferably LEDs and more preferably LED chips. Preferably, the first light emitting elements 101 are electrically connected to each other through wiring lines (not shown). Preferably, the wiring lines are connected to the first electrode 1 and 521 or the second electrode 1 and 522. External electric power applied to the first electrode 1 and 521 and the second electrode 1 and 522 from the external terminals is thereby supplied to the first light emitting elements 101 through the wiring lines. This allows the first light emitting elements 101 to emit light.

The first light emitting elements 101 and the electrode lands are electrically connected to the wiring lines. When each of the first light emitting elements 101 is of the face-up type, i.e., of the type in which the anode and cathode are disposed on the upper surface of the chip, gold wires are used for connection. Alternatively, when each of the first light emitting elements 101 is of the flip type, i.e., the type in which the anode and cathode are disposed on the lower surface, solder, a silver paste, or gold-tin eutectic bumps are used for connection. Alternatively, when each of the first light emitting elements 101 is of the upper-lower electrode type, a gold wire is used for electrical connection of the electrode on the upper surface of the chip, and solder, a silver paste, or a gold-tin eutectic bump is used for electrical connection of the electrode on the lower surface of the chip. Specifically, the wiring pattern on the substrate selected and the structure of the wiring lines must be changed according to the type of chips.

No particular limitation is imposed on the arrangement pattern of the first light emitting elements 101. However, preferably, the first light emitting elements 101 disposed on the upper surface of the substrate 511 are arranged at regular intervals in a region surrounded by the dam ring 551. This can reduce color unevenness and brightness unevenness on a surface irradiated with the light from the light source device 18. Therefore, the optical characteristics of the light source device 18 can be maintained at a high level.

As described above, no particular limitation is imposed on the arrangement pattern of the first light emitting elements 101. However, the first light emitting elements 101 must be arranged such that a peak appears in a wavelength range of 380 nm or more to less than 420 nm in the emission spectrum of the light source device 18.

No particular limitation is imposed on the connection mode of the first light emitting elements 101. However, when the first light emitting elements 101 form a plurality of element rows each including light emitting elements connected in series, it is preferable to electrically connect the first light emitting elements 101 such that all the rows include the same number of first light emitting elements 101 connected in series. This allows the same current (the same current value) to flow through all the light emitting elements included in the light source device 18. Therefore, the optical characteristics of the light source device 18 can be maintained at a high level.

(Optical Characteristics of Light Emitting Elements)

The output light from each of the first light emitting elements 101 has a peak in a wavelength range of 380 nm or more to less than 420 nm (the peak wavelength of the output light is, for example, 405 nm). Specifically, each first light emitting element 101 is a light emitting element and is preferably a light emitting diode. Therefore, at least part of the output light from the first light emitting elements 101 constitutes part (e.g., a violet component) of the light (e.g., white light) from the light source device 18.

(Far-Red Phosphor)

The far-red phosphor 611 emits far-red light when excited by the output light from the first light emitting elements 101 and is preferably, for example, (1) described above and particularly preferably Cr-activated $Gd_3Ga_5O_{12}$ ($Gd_3Ga_5O_{12}:Cr^{3+}$).

(Red Phosphor)

The red phosphor 621 emits red light when excited by the output light from the first light emitting elements 101, and, for example, (11) to (15) described above are preferred. The red phosphor 621 used may be any one of the above (11) to (15) or a combination of two or more of the above (11) to (15).

(Green Phosphor)

The preen phosphor 631 emits green light when excited by the output light from the first light emitting elements 101, and, for example, (21) to (28) described above are preferred. The green phosphor 631 used may be any one of the above (21) to (28) or a combination of two or more of the above (21) to (28).

(Blue Phosphor)

The blue phosphor 641 emits blue light when excited by the first light emitting elements 101. The blue phosphor 641 may be divalent europium-activated halophosphate shown in (31) above, divalent europium-activated aluminum oxide shown in (32) above, or trivalent cerium-activated nitride shown in (3) above. The blue phosphor 641 used may be any one of the above (31) to (33) or a combination of two or more of the above (31) to (33).

[Another Form of Light Source Device]

The light source device 18 may have the following structure.

In addition to the first light emitting elements 101, the second light emitting elements 102 and/or the third light emitting elements 103 described above may be used. Each second light emitting element 102 has an emission peak in a wavelength range of 420 nm or more to less than 460 nm, and each third light emitting element 103 has an emission peak in a wavelength range of 460 nm or more to less than 490 nm. Therefore, the combination of the light emitting elements can be selected from a wider range, and the phosphors can be selected from a wider range.

More specifically, even when a resin containing a phosphor not easily excited by the output light from the first light emitting elements 101 is used, the light emission efficiency of the phosphor can be maintained at a high level through the output light from the second light emitting elements 102 and/or the output light from the third light emitting elements 103. The light emission efficiency of the light source device 18 can thereby be further improved. Therefore, a variety of emission spectrums can be obtained. Since the design flexibility of the emission spectrum can be increased, the light source device 18 can have a desired emission spectrum more easily.

[Application to Lighting System, Backlight Device, Sensor Device, Etc.]

The light source device 18 has the optical characteristics described above. Therefore, the light source device 18 can be used as a light source of a light emitting device (examples of the light emitting device include light source devices for sensors, lighting systems, and backlight devices). The light emitting device in the present embodiment includes the light source device 18. Therefore, the light emitting device provided as, for example, a light source device for a sensor, a lighting system, or a backlight device can have the above-described optical characteristics. In the light source device for a sensor, the lighting system, and the backlight device in the present embodiment, structural components included in conventional light source devices for sensors, lighting systems, and backlight devices other than their light source devices may be used without any limitation.

Embodiment 9: COB Using Multi-Wavelength Chips of the Same Type

Figure 9:
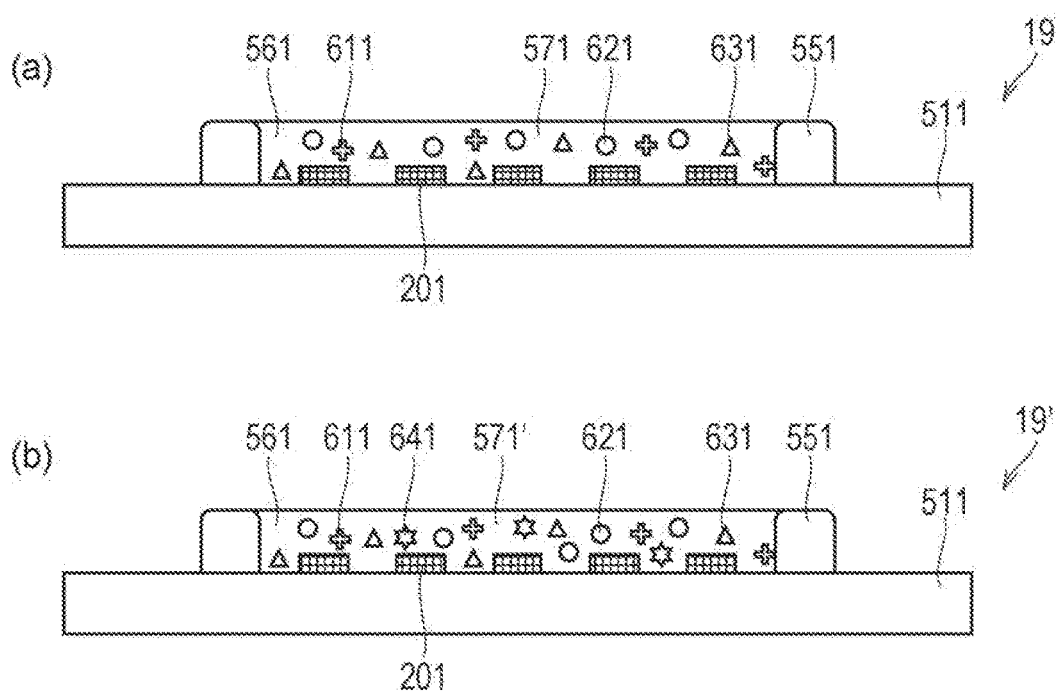
FIG. 9(a) is a cross-sectional view of a light source device 19 in embodiment 9 of the present invention.
FIG. 9(b) is a cross-sectional view of a light source device 19' in a modification of embodiment 9 of the present invention.

FIG. 9(*a*) is a cross-sectional view of a light source device 19 in embodiment 9 of the present invention, and FIG. 9(*b*) is a cross-sectional view of a light source device 19' in a modification of embodiment 9 of the present invention. The light source device 19, 19' in the present embodiment Includes a substrate 511, fourth light emitting elements 201, and a resin layer 571, 571' containing phosphors (hereinafter denoted simply as a "phosphor-containing resin layer"). Each of the fourth light emitting elements 201 emits output light, having a peak in a wavelength range of 380 nm or more to less than 420 nm and a peak in a wavelength range of 420 nm or more to less than 460 nm. In the fourth light emitting elements 201, the wavelength range of 380 nm or more to less than 420 nm is preferably a wavelength range of 400 nm or more to less than 420 nm. Most light emitting elements have a half width of 20 nm or less, but this depends on the type of light emitting element. Generally, a phosphor that emits light when irradiated with light of 380 nm or more to less than 420 nm has an emission peak wavelength of at least about 430 nm, and its half width is 30 nm or more. Specifically, in view of the emission spectrum of the phosphor and the emission spectrum of the light emitting element, when the emission peak of the light emitting element is in a wavelength range of 380 nm or more to less than 420 nm, an emission component is present in the target wavelength range of 400 nm or more. When the emission peak of the light emitting element is in a wavelength range of 400 nm or more to less than 420 nm, an emission spectrum with more uniform spectral intensity can be easily obtained. Therefore, when the emission peak is in a wavelength range of 380 nm or more to less than 420 nm and more preferably in a wavelength range of 400 nm or more to less than 420 nm, a light source device having sufficient emission components in the target wavelength range of from 400 nm to 750 nm inclusive can be obtained.

Examples of the material of the substrate for mounting the chips include PPA (polyphthalamide) resins, PCT (polycyclohexylene-dimethylene-terephthalate) resins, EMS resins (epoxy molding compound resins), silicone resins, and ceramics. In the present invention, unlike light source devices for illumination and back light applications that include light source elements having a peak wavelength mainly around 450 nm, light source elements having a peak around 380 to 420 nm are used. Specifically, in this case, the light energy from the mounted light emitting elements is higher than that from a general light source device. Therefore, preferably, the material of the substrate has high light durability. Specially the material is more preferably a PCT resin, an EMC resin, a silicone resin, or a ceramic and still more preferably an EMC resin, a silicone resin, or a ceramic.

To bond the chips to the substrate, die bonding is necessary.

A face-up type light emitting element has wire-bondable anode and cathode electrodes on an upper surface of a chip. Example of the material of a die bonding paste when the face-up type light emitting element is used include epoxy resins, transparent and semi-transparent silicone resins, white silicone resins, and silver pastes. The light transmittance of die bonding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is high, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes LED chips having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are disposed on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

The substrate 511 is preferably a ceramic substrate and has preferably a rectangular shape in plan view. The fourth light emitting elements 201, a dam ring (resin-made frame) 551, and a phosphor-containing resin layer 561 are disposed on one surface of the substrate 511 (hereinafter denoted as the "upper surface of the substrate 511"). Moreover, a first electrode 1 and 521 and a second electrode 1 and 522 are disposed on the upper surface.

The dam ring 551 is a member that defines the outer shape of the phosphor-containing resin layer 571, 571' (the phosphor-containing resin layer 571 in the light source device 19 in the example shown in FIG. 9(a) includes a resin 561, a far-red phosphor 611, a red phosphor 621, and a green phosphor 631, and the phosphor-containing resin layer 571' in the light source device 19' in the example shown in FIG. 9(b) includes the resin 561, the far-red phosphor 611, the red phosphor 621, the green phosphor 631, and a blue phosphor 641). The dam ring 551 serves as a dam (a damming member) for preventing leakage to the outside of the dam ring 551 when the phosphor-containing resin layer 571, 571' is formed.

The first electrode 1 and 521 and the second electrode 1 and 522 are disposed on the upper surface of the substrate 511 in positions outside the dam ring 551. The first electrode 1 and 521 and the second electrode 1 and 522 are disposed preferably at corners on the upper surface of the substrate 511 and more preferably on a diagonal line of the substrate 511. A surface of the first electrode 1 and 521 and a surface of the second electrode 1 and 522 are exposed, so that the first electrode 1 and 521 and the second electrode 1 and 522 can be connected to external terminals. Specifically, one of the first electrode 1 and 521 and the second electrode 1 and 522 serves as an anode electrode for external connection, and the other one serves as a cathode electrode for external connection.

(Light Emitting Elements)
(Arrangement Pattern and Connection Mode)

The fourth light emitting elements 201 are preferably LEDs and more preferably LED chips. Preferably, the fourth light emitting elements 201 are electrically connected to each other through wiring lines (not shown). Preferably, the wiring lines are connected to the first electrode 1 and 521 or the second electrode 1 and 522. External electric power applied to the first electrode 1 and 521 and the second electrode 1 and 522 from the external terminals is thereby supplied to the fourth light emitting elements 201 through the wiring lines. This allows the fourth light emitting elements 201 to emit light.

The fourth light emitting elements 201 and the electrode lands are electrically connected to the wiring lines. When each of the fourth light emitting elements 201 is of the face-up type, i.e., of the type in which the anode and cathode are disposed on the upper surface of the chip, gold wires are used for connection. Alternatively, when each of the fourth light emitting elements 201 is of the flip type, i.e., the type in which the anode and cathode are disposed on the lower surface, solder, a silver paste, or gold-tin eutectic bumps are used for connection. Alternatively, when each of the fourth light emitting elements 201 is of the upper-lower electrode type, a gold wire is used for electrical connection of the electrode on the upper surface of the chip, and solder, a silver paste, or a gold-tin eutectic bump is used for electrical connection of the electrode on the lower surface of the chip. Specifically, the wiring pattern on the substrate selected and the structure of the wiring lines must be changed according to the type of chips.

No particular limitation is imposed on the arrangement pattern of the fourth light emitting elements 201. However, preferably, the fourth light emitting elements 201 disposed on the upper surface of the substrate 511 are arranged at regular intervals in a region surrounded by the dam ring 551. This can reduce color unevenness and brightness unevenness on a surface irradiated with the light from the light source device 19, 19'. Therefore, the optical characteristics of the light source device 19, 19' can be maintained at a high level.

No particular limitation is imposed on the connection mode of the fourth light emitting elements 201. However, when the fourth light emitting elements 201 form a plurality of element rows each including light emitting elements connected in series, it is preferable to electrically connect the fourth light emitting elements 201 such that all the rows include the same number of fourth light emitting elements 201 connected in series. This allows the same current (the same current value) to flow through all the light emitting elements included in the light source device 19, 19'. Therefore, the optical characteristics of the light source device 19, 19' can be maintained at a high level.

(Optical Characteristics of Light Emitting Elements)

The output light from each of the fourth light emitting elements 201 has two peak wavelengths in two wavelength ranges, i.e., a peak wavelength in a wavelength range of 380 nm or more to less than 420 nm and a peak wavelength in a wavelength range of 420 nm or more to less than 460 nm (the peak wavelengths of the output light are, for example, 405 nm and 445 nm). Specifically, each of the fourth light emitting elements 201 is a light emitting element and is preferably a light emitting diode. Therefore, at least part of the output light from the fourth light emitting elements 201 constitutes part (e.g., a violet or blue component) of the light (e.g., white light) from the light source device 19, 19'.

As described above, the light source device 19, 19' includes, as light emitting elements, the fourth light emitting elements 201 that emit output light having a peak in a wavelength range of 380 nm or more to less than 420 nm and a peak in a wavelength range of 420 nm or more to less than 460 nm.

(Phosphor-Containing Resin Layer)

The phosphor-containing resin layer 571 in the light source device 19 in the example shown in FIG. 9(a) contains the resin 561, the far-red phosphor 611, the red phosphor 621, and the green phosphor 631. The phosphor-containing resin layer 571' in the light source device 19' in the example shown in FIG. 9(b) contains the resin 561, the far-red phosphor 611, the red phosphor 621, the green phosphor 631, and the blue phosphor 641. Preferably, each of the phosphor-containing resin layers 571 and 571' is formed by filling the region on the upper surface of the substrate 511 that is surrounded by the dam ring 551 with the resin 561, the far-red phosphor 611, the red phosphor 621, and the green phosphor 631 (and the blue phosphor 641 in the case of the phosphor-containing resin layer 571') and then curing the resin 561. Preferably, the phosphor-containing resin layer 571, 571' is disposed such that the fourth light emitting elements 201 disposed on the upper surface of the substrate 511 in the region surrounded by the dam ring 551 are embedded in the phosphor-containing resin layer 571. Specifically, in the present embodiment, the fourth light emitting elements 201 are sealed with the phosphor-containing resin layer 571, 571' alone. In the present description, the phrase "sealed with the phosphor-containing resin layer 571, 571' alone" means that a single resin is used for sealing.

The resin contained in the phosphor-containing resin layer 571, 571' is preferably a resin with high light transmittance and more preferably a resin that can transmit the output light from the fourth light emitting elements 201, far-red light emitted from the far-red phosphor 611, red light emitted from the red phosphor 621, green light emitted from the green phosphor 631, and blue light emitted from the blue phosphor 641. No particular limitation is imposed on the resin 561, so long as it can be used as a sealing resin included in a resin-sealed light source device. Preferred examples of such a resin include dimethyl-based silicone resins, phenyl-based silicone resins, and epoxy resins.

(Far-Red Phosphor)

The far-red phosphor 611 emits far-red light when excited by the output light from the fourth light emitting elements 201 and is preferably, for example, (1) described above and particularly preferably Cr-activated $Gd_3Ga_5O_{12}$ ($Gd_3Ga_5O_{12}:Cr^{3+}$).

(Red Phosphor)

The red phosphor 621 emits red light when excited by the output light from the fourth light emitting elements 201, and, for example, (11) to (15) described above are preferred. The red phosphor 621 used may be any one of the above (11) to (15) or a combination of two or more of the above (11) to (15).

(Green Phosphor)

The green phosphor 631 emits green light when excited by the output light from the fourth light emitting elements 201, and, for example, (21) to (28) described above are preferred. The green phosphor 631 used may be any one of the above (21) to (28) or a combination of two or more of the above (21) to (28).

(Blue Phosphor)

The blue phosphor 641 emits blue light when excited by the fourth light emitting elements 201. The blue phosphor 641 may be divalent europium-activated halophosphate shown in (31) above, divalent europium-activated aluminum oxide shown in (32) above, or trivalent cerium-activated nitride shown in (33) above. The blue phosphor 641 used may be any one of the above (31) to (33) or a combination of two or more of the above (31) to (33).

The far-red phosphor 611 is preferably Cr-activated $Gd_3Ga_5O_{12}$, and the red phosphor 621 is preferably $Sr_xCa_{1-x}AlSiN_3:Eu^{1+}$. The green phosphor 631 is preferably divalent europium-activated β-SiAlON, and the blue phosphor 641 is preferably divalent europium-activated halosilicate. The far-red phosphor 611, the red phosphor 621, the green phosphor 631, and the blue phosphor 641 are not limited to the above phosphors and may be phosphors shown below. Preferably, the combination of the light emitting element and the phosphors is selected such that optimum conditions are obtained in view of the excitation characteristics of the phosphors.

The phosphor-containing resin layer 571, 571' contains the far-red phosphor 611 and may further contain only one of the red phosphor 621, the green phosphor 631, and the blue phosphor 641. The far-red phosphor 611 used may include two or more far-red phosphors, and the red phosphor 621 used may include two or more red phosphors. The green phosphor 631 used may include two or more green phosphors, and the blue phosphor 641 used may include two or more blue phosphors. When the phosphor-containing resin layer 371 contains at least one far-red phosphor 611, at least one red phosphor 621, at least one green phosphor 631, and at least one blue phosphor 641, the light source device 19, 19' can serve as a light source having the intended spectrum.

[Another Form of Light Source Device]

The light source device 19, 19' may have the following structure.

In addition to the fourth light emitting elements 201, the third light emitting elements 103 described above may be used. Each of the third light emitting elements 103 emits light having an emission peak in a wavelength range of 460 nm or more to less than 490 nm. Therefore, the combination of the light emitting elements can be selected from a wider range, and the phosphors can be selected from a wider range. Moreover, the light emitted from the third light emitting elements 103 can contribute to the emission spectrum of the light source device 19, 19'. More specifically, even when a resin containing a phosphor not easily excited by the output light from the fourth light emitting elements 201 is used, the light emission efficiency of the phosphor can be maintained at a high level, and the light emission efficiency of the light source device 19, 19' can be further improved. The light emitted from the third light emitting elements 103 can increase the design flexibility of the spectral shape of the light source device 19, 19'. This allows a variety of emission spectrums to be obtained. The design flexibility of the emission spectrum can thereby be increased, so that the light source device 19, 19' can have a desired emission spectrum more easily.

[Application to Lighting System, Backlight Device, Sensor Device, Etc.]

The light source device 19 has the optical characteristics described above. Therefore, the light source device 19 can be used as a light source of a light emitting device (examples of the light emitting device include light source devices for sensors, lighting systems, and backlight devices). The light emitting device in the present embodiment includes the light source device 19. Therefore, the light emitting device provided as, for example, a light source device for a sensor, a lighting system, or a backlight device can have the above-described optical characteristics. In the light source device for a sensor, the lighting system, and the backlight device in the present embodiment, structural components included in conventional light source devices for sensors, lighting systems, and backlight devices other than their light source devices may be used without any limitation.

Embodiment 10: COB Using Multiple Light Emission Chips

Figure 10:
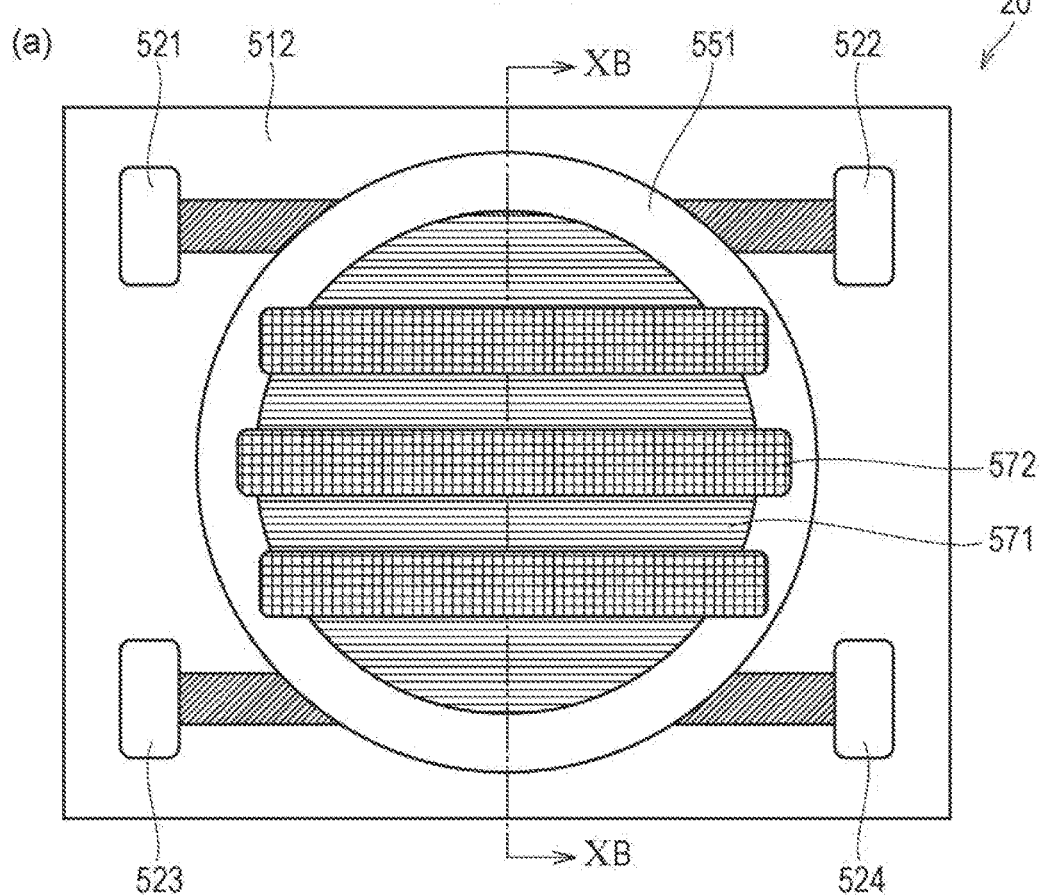
FIG. 10(a) is a plan view of a light source device 20 in embodiment 10 of the present invention.
FIG. 10(b) is a cross-sectional view of the light source device 20 shown in FIG. 10(a), the cross-sectional view being taken along cutting plane line XB-XB.
FIG. 10(c) is a cross-sectional view of a light source device 20' in a modification of: embodiment 10 of the present invention.
Figure 10:
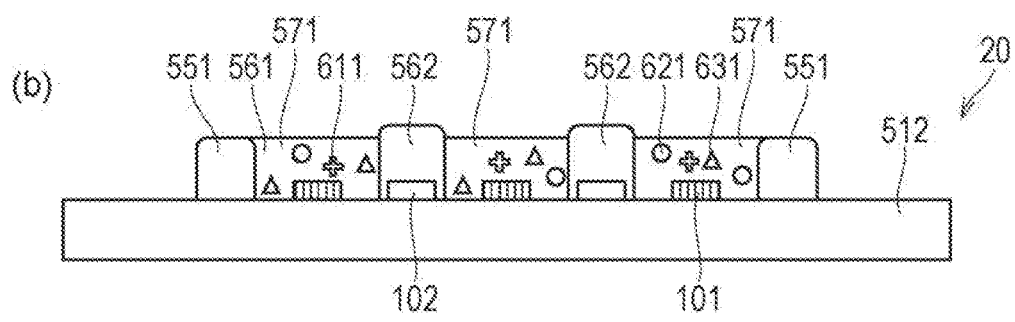
Figure 10:
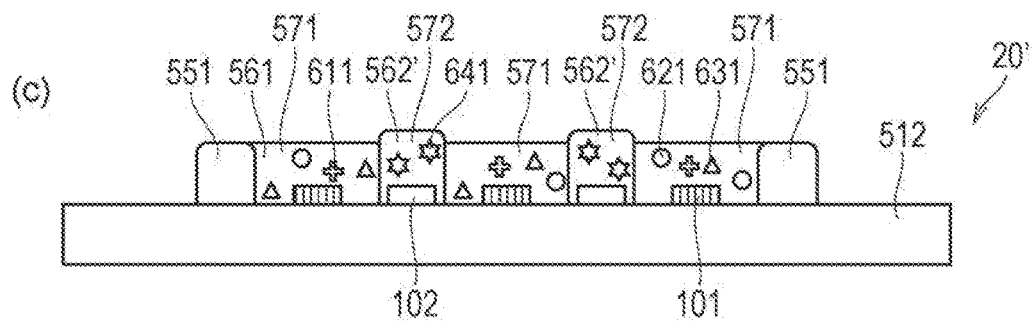

FIG. 10(a) is a plan view of a light source device 20 in embodiment 10 of the invention, and FIG. 10(b) is a cross-sectional view of the light source device 20 shown in FIG. 10(a), the cross-sectional view being taken along cutting plane line XB-XB. FIG. 10(c) is a cross-sectional view of a light source device 20' in a modification of embodiment 10 of the invention. The light source device 20, 20' in the present embodiment includes a substrate 512, first light emitting elements 101, second light emitting elements 102, a resin layer 571 containing phosphors (hereinafter denoted simply as a "phosphor-containing resin layer"), and a resin layer 562. The resin layer 526 in the example shown in FIG. 10(b) contains no phosphors. The peak wavelength of the output light from the first light emitting elements 101 differs from the peak wavelength of the output light from the second light emitting elements 102.

Examples of the material of the substrate for mounting the chips include PPA (polyphthalamide) resins, PCT (polycyclohexylene-dimethylene-terephthalate) resins, EMC resins (epoxy molding compound resin), silicone resins, and ceramics. In the present invention, unlike light source devices for illumination and back light applications that include light source elements having a peak wavelength mainly around 450 nm, light source elements having a peak around 380 to 420 nm are used. Specifically, in this case, the light energy from the mounted light emitting elements is higher than that from a general light source device. Therefore, preferably, the material of the substrate has high light durability. Specifically, the material is more preferably a PCT resin, an EMC resin, a silicone resin, or a ceramic and still more preferably an EMC resin, a silicone resin, or a ceramic.

To bond the chips to the substrate, die bonding is necessary.

A face-up type light emitting element has wire-bondable anode and cathode electrodes on an upper surface of a chip. Example of the material of a die bonding paste when the face-up type light emitting element is used include epoxy resins, transparent and semi-transparent silicone resins, white silicone resins, and silver pastes. The light transmittance of die boding pastes formed from silicone resins changes mainly depending on whether or not a scattering agent is present. The resins used as base materials have approximately the same properties. In many of these resins, the transmittance in the violet to blue wavelength range is lower than that in the green and red wavelength ranges. It is known that these resins deteriorate when exposed to short-wavelength light and cracking thereby occurs. Therefore, when a transparent or semi-transparent silicone resin is used for a die bonding paste resin, the possibility that the die bonding paste resin is cracked in a shorter operating time is higher. The reflectance of a silver paste is high, and the possibility of cracking due to light is lower in the silver paste than in the silicone resin. In white silicone resins and silver pastes, light absorption in the violet range is lower than that in transparent and semi-transparent silicone resins, so that the occurrence of cracking can be prevented. Therefore, the die bonding paste used for the light source device of the present invention that includes LED chips having an emission peak in a wavelength range of 380-420 nm is more preferably a white silicone resin or a silver paste.

An upper-lower electrode type light emitting element or a flip-type light emitting element (i.e., a light emitting element of the type in which both the anode and cathode are disposed on the lower surface of the element) is bonded to a frame using solder, a silver paste, or gold-tin eutectic bumps. In this case, the possibility of cracking due to light is low, and this is a chip bonding method suitable for the present invention. Different electrical connection methods are used for different types of light emitting elements, and different frame structures must be selected accordingly.

The substrate 512 is preferably a ceramic substrate and has preferably a rectangular shape in plan view. The first light emitting elements 101, the second light emitting elements 102, a dam, ring (resin-made frame) 551, the phosphor-containing resin layer 571, and the resin layer 562 are disposed on one surface of the substrate 512 (hereinafter denoted as the "upper surface of the substrate 512"). Moreover, a first electrode 1 and 521, a second electrode 1 and 522, a third electrode 1 and 521, and a fourth electrode 1 and 524 are disposed on the upper surface.

The dam ring 551 and the resin layer 562 are members that define the outer shape of the phosphor-containing resin layer 571 (the phosphor-containing resin layer 571 contains a resin 561, a far-red phosphor 611, a red phosphor 621, and a green phosphor 631) and serves as a dam (a damming member) for preventing leakage to the outside of the dam ring 551 when the phosphor-containing resin layer 571 is formed.

The first electrode 1 and 521, the second electrode 1 and 522, the third electrode 1 and 523, and the fourth electrode 1 and 524 are disposed on the upper surface of the substrate 512 in positions outside the dam ring 551 and are disposed preferably at corners on the upper surface of the substrate 512. More preferably, the first electrode 1 and 521 and the third electrode 1 and 523 are disposed on a diagonal line of the substrate 512, and the second electrode 1 and 522 and the fourth electrode 1 and 524 are disposed on another diagonal line of the substrate 512. A surface of the first electrode 1 and 521, a surface of the second electrode 1 and 522, surface of the third electrode 1 and 523, and a surface of the fourth electrode 1 and 524 are exposed, so that the first electrode 1 and 521, the second electrode 1 and 522, the third electrode 1 and 523, and the fourth electrode 1 and 524 can be connected to external terminals. Specifically, two of the first electrode 1 and 521, the second electrode 1 and 522, the third electrode 1 and 523, and the fourth electrode 1 and 524 serve as anode electrodes for external connection, and the rest of the lands serve as cathode electrodes for external connection.

(Light Emitting Elements)
(Arrangement Pattern and Connection Mode)

The first light emitting elements 101 and the second light emitting elements 102 are preferably LEDs and more preferably LED chips. Preferably, the first light emitting elements 101 are electrically connected to each other through wiring lines (not shown), and the second light emitting elements 102 are electrically connected to each other through wiring lines (not shown). Preferably, the wiring lines are connected to the first electrode 1 and 521, the second electrode 1 and 522, the third electrode 1 and 523, or the fourth electrode 1 and 524. External electric power applied to the first electrode 1 and 521, the second electrode 1 and 522, the third electrode 1 and 523, and the fourth electrode 1 and 524 from the external terminals is thereby supplied to the first light emitting elements 101 and the second light emitting elements 102 through the wiring lines. This allows the first light emitting elements 101 and the second light emitting elements 102 to emit light.

The first light emitting elements 101, the second light emitting elements 102, and the electrode lands are electrically connected to the wiring lines. When each of the first light emitting elements 101 and the second light emitting elements 102 is of the face-up type, i.e., of the type in which the anode and cathode are disposed on the upper surface of the chip, gold wires are used for connection. Alternatively, when each of the first light emitting elements 101 and the second light emitting element 102 is of the flip type, i.e., the type in which the anode and cathode are disposed on the lower surface, solder, a silver paste, or gold-tin eutectic bumps are used for connection. Alternatively, when each of the first light emitting elements 101 and the second light emitting elements 102 is of the upper-lower electrode type, a gold wire is used for electrical connection of the electrode on the upper surface of the chip, and solder, a silver paste, or a gold-tin eutectic bump is used for electrical connection of the electrode on the lower surface of the chip. Specifically, the wiring pattern on the substrate selected and the structure of the wiring lines must be changed according to the type of chips.

No particular limitation is imposed on the arrangement pattern of the first light emitting elements 101 and the second light emitting elements 102. However, preferably, the first light emitting elements 101 and the second light emitting elements 102 disposed on the upper surface of the substrate 512 are arranged at regular intervals in a region surrounded by the dam ring 551. This can reduce color unevenness and brightness unevenness on a surface irradiated with the light from the light source device 20. Therefore, the optical characteristics of the light source device 20 can be maintained at a high level.

As described above, no particular limitation is imposed on the arrangement pattern of the first light emitting elements 101 and the second light emitting elements 102. However, the first light emitting elements 101 and the second light emitting elements 102 must be arranged such that peaks appear in wavelength ranges of 420 nm or more to less than 460 nm and of 460 nm or more to 490 nm or less in the emission spectrum of the light source device 20.

No particular limitation is imposed on the connection mode of the first light emitting elements 101 and the second light emitting elements 102. However, when the first light emitting elements 101 and the second light emitting elements 102 form a plurality of element rows each including light emitting elements connected in series, it is preferable to electrically connect the first light emitting elements 101 and the second light emitting elements 102 such that all the rows include the same number of first light emitting elements 101 or second light emitting elements 102 connected in series. This allows the same current (the same current value) to flow through all the light emitting elements included in the light source device 20. Therefore, the optical characteristics of the light source device 20 can be maintained at a high level.

(Optical Characteristics of Light Emitting Elements)

The output light from each of the first light emitting elements 101 has a peak in a first wavelength range of 380 nm or more to less than 420 nm (the peak wavelength of the output light is, for example, 405 nm), and the output light from each of the second light emitting elements 102 has a peak in a second wavelength range of 420 nm or more to less than 460 nm (the peak wavelength of the output light is, for example, 460 nm). Specifically, each of the first light emitting elements 101 and the second light emitting elements 102 is a light emitting element and is preferably a light emitting diode. Therefore, at least part of the output light from the first light emitting elements 101 and the second light emitting elements 102 constitutes part (e.g., a violet or blue component) of the light (e.g., white light) from the light source device 20.

As described above, the light source device 20 includes: the first light emitting elements 101 each serving as a light emitting element that emits output light having a peak in a first wavelength range of 380 nm or more to less than 420 nm; and the second light emitting elements 102 each serving as a light emitting element that emits output light having a peak in a second wavelength range of 420 nm or more to less than 460 nm. Preferably, each of the first light emitting elements 101 has an emission peak in a first wavelength range of 400 nm or more to less than 420 nm. Most light emitting elements have a half width of 20 nm or less, but this depends on the type of light emitting element. Generally, a phosphor that emits light when irradiated with light of 380 nm or more to less than 420 nm has an emission peak wavelength of at least about 430 nm, and its half width is 30 nm or more. Specifically, in view of the emission spectrum of the phosphor and the emission spectrum of the light emitting element, when the emission peak of the light emitting element is in a wavelength range of 380 nm or more to less than 420 nm, an emission component is present in the target wavelength range of 400 nm or more. When the emission peak of the light emitting element is in a wavelength range of 400 nm or more to less than 420 nm, an emission spectrum with more uniform spectral intensity can be easily obtained. Therefore, when the emission peak is in a wavelength range of 380 nm or more to less than 420 nm and more preferably in a wavelength range of 400 nm or more to less than 420 nm, a light source device having sufficient emission components in the target wavelength range of from 400 nm to 750 nm inclusive can be obtained.

FIG. 10(b) exemplifies the case in which the resin layer 562 contains no phosphors. However, the resin layer may contain phosphors, as in the light source device 20' in the example shown in FIG. 10(c). In this case, the phosphor-containing resin layer 571 is referred to as a "first phosphor-containing resin layer," and the resin layer 572 containing the phosphors is referred to as a "second phosphor-containing resin layer."

(First Phosphor-Containing Resin Layer)

The first phosphor-containing resin layer 571 contains the resin 561, the far-red phosphor 611, the red phosphor 621, the green phosphor 631, and the blue phosphor 641. Preferably, the first phosphor-containing resin layer 571 is formed by filling regions located on the upper surface of the substrate 512 and surrounded by the dam ring 551 with the resin 561, the far-red phosphor 611, the red phosphor 621, the green phosphor 631, and the blue phosphor 641 and then curing the resin 561. Preferably, the first phosphor-containing resin layer 571 is disposed such that the first light emitting elements 101 disposed in the regions located on the upper surface of the substrate 512 and surrounded by the dam ring 551 are embedded in the first phosphor-containing resin layer 571.

(Second Phosphor-Containing Resin Layer)

The second phosphor-containing resin layer 572 contains a resin 562', the far-red phosphor 611, the red phosphor 621, the green phosphor 631, and the blue phosphor 641. Preferably, the second phosphor-containing resin layer 572 is formed by filling regions located on the upper surface of the substrate 512 and surrounded by the dam ring 551 with the resin 562', the far-red phosphor 611, the red phosphor 621, the green phosphor 631, and the blue phosphor 641 and then curing the resin 562'. Preferably, the second phosphor-containing resin layer 572 is disposed such that the second light emitting elements 102 disposed in the regions located on the upper surface of the substrate 512 and surrounded by the dam ring 551 are embedded in the second phosphor-containing resin layer 572.

(Sealing Form)

In the present embodiment, the first light emitting elements 101 are sealed with the first phosphor-containing resin layer 571. The second light emitting elements 102 are sealed with the second phosphor-containing resin layer 572.

Each of the resin 561 contained in the first phosphor-containing resin layer 571 and the resin 562' contained in the second phosphor-containing resin layer 572 is preferably a resin with high light transmittance and more preferably a resin that can transmit the output light from the first light emitting elements 101, the output light from the second light emitting elements 102, far-red light emitted from the far-red phosphor 611, red light emitted from the red phosphor 621, green light emitted from the green phosphor 631, and blue light emitted from the blue phosphor 641. No particular limitation is imposed on the resin 561 and the resin 562', so long as they can be used as a sealing resin contained in a resin-sealed light source device. Preferred examples of such a resin include dimethyl-based silicone resins, phenyl-based silicone resins, and epoxy resins.

(Far-Red Phosphor)

The far-red phosphor 611 emits far-red light when excited by the output light from the first light emitting elements 101 or the output light from the second light emitting elements 102 and is preferably, for example, (1) described above and particularly preferably Cr-activated $Gd_3Ga_5O_{12}$ ($Gd_3Ga_5O_{12}:Cr^{3+}$).

(Red Phosphor)

The red phosphor 621 emits red light when excited by the output light from the first light emitting elements 101 or the output light from the second light emitting elements 102, and, for example, (11) to (15) described above are preferred.

The red phosphor 621 used may be any one of the above (11) to (15) or a combination of two or more of the above (11) to (15).
(Green Phosphor)

The preen phosphor 631 emits green light when excited by the output light from the first light emitting elements 101 or the output light from the second light emitting elements 102, and, for example, (21) to (28) described above are preferred. The green phosphor 631 used may be any one of the above (21) to (28) or a combination of two or more of the above (21) to (28).
(Blue Phosphor)

The blue phosphor 641 emits blue light when excited by the first light emitting elements 101 or the second light emitting elements 102. The blue phosphor 641 may be divalent europium-activated halophosphate shown in (31) above, divalent europium-activated aluminum oxide shown in (32) above, or trivalent cerium-activated nitride shown in (33) above. The blue phosphor 641 used may be any one of the above (31) to (33) or a combination of two or more of the above (31) to (33).

The far-red phosphor 611 is preferably Cr-activated $Gd_3Ga_5O_{12}$, and the red phosphor 621 is preferably $Sr_xCa_{1-x}AlSiN_3:Eu^{2+}$. The green phosphor 631 is preferably divalent europium-activated β-SiAlON, and the blue phosphor 641 is preferably divalent europium-activated halosilicate. The far-red phosphor 611, the red phosphor 621, the green phosphor 631, and the blue phosphor 641 are not limited to these phosphors, and any of the above-described phosphors may be used. Preferably, the combination of the light emitting elements and the phosphors is selected such that optimum conditions are obtained in view of the excitation characteristics of the phosphors.

The first phosphor-containing resin layer 571 or the second phosphor-containing resin layer 572 contains the far-red phosphor 611 and may further contain only one of the red phosphor 621, the green phosphor 631, and the blue phosphor 641. The far-red phosphor 611 used may include two or more far-red phosphors, and the red phosphor 621 used may include two or more red phosphors. The green phosphor 631 used may include two or more green phosphors, and the blue phosphor 641 used may include two or more blue phosphors. When the first phosphor-containing resin layer 571 or the second phosphor-containing resin layer 572 contains at least one far-red phosphor 611, at least one red phosphor 621, at least one green phosphor 631, and at least one blue phosphor 641, the light source device 20' can serve as a light source having the intended spectrum.
[Another Form of Light Source Device]

The light source device 20, 20' may have the following structure.

In addition to the first light emitting elements 101 and the second light emitting elements 102, the third light emitting elements 103 may be used. Each third light emitting element 103 has an emission peak in a wavelength range of 460 nm or more to less than 490 nm. Therefore, the combination of the light emitting elements can be selected from a wider range, and the phosphors can be selected from a wider range. More specifically, even when a resin containing a phosphor not easily excited by the output light from the first light emitting elements 101 and the output light from the second light emitting elements 102 is used, the light emission efficiency of the phosphor can be maintained at a high level. Therefore, the light emission efficiency of the light source device 20, 20' can be further improved. The output light from the third light emitting elements may be used to contribute to the emission spectrum of the light source device 20, 20'. Therefore, a variety of emission spectrums can be obtained. Since the design flexibility of the emission spectrum can be increased, the light source device 20, 20' can have a desired emission spectrum more easily.
[Application to Light Emitting Devices Such as Lighting System and Backlight Device]

The light source device 20, 20' has the optical characteristics described above. Therefore, the light source device 20, 20' can be used as a light source of a light emitting device (examples of the light emitting device include light source devices for sensors, lighting systems, and backlight devices). The light emitting device in the present embodiment includes the light source device 20, 20'. Therefore, the light emitting device provided as, for example, a light source device for a sensor, a lighting system, or a backlight device can have the above-described optical characteristics. In the light source device for a sensor, the lighting system, and the backlight device in the present embodiment, structural components included in conventional light source devices for sensors, lighting systems, and backlight devices other than their light source devices may be used without any limitation.

Embodiment 11

Figure 11:
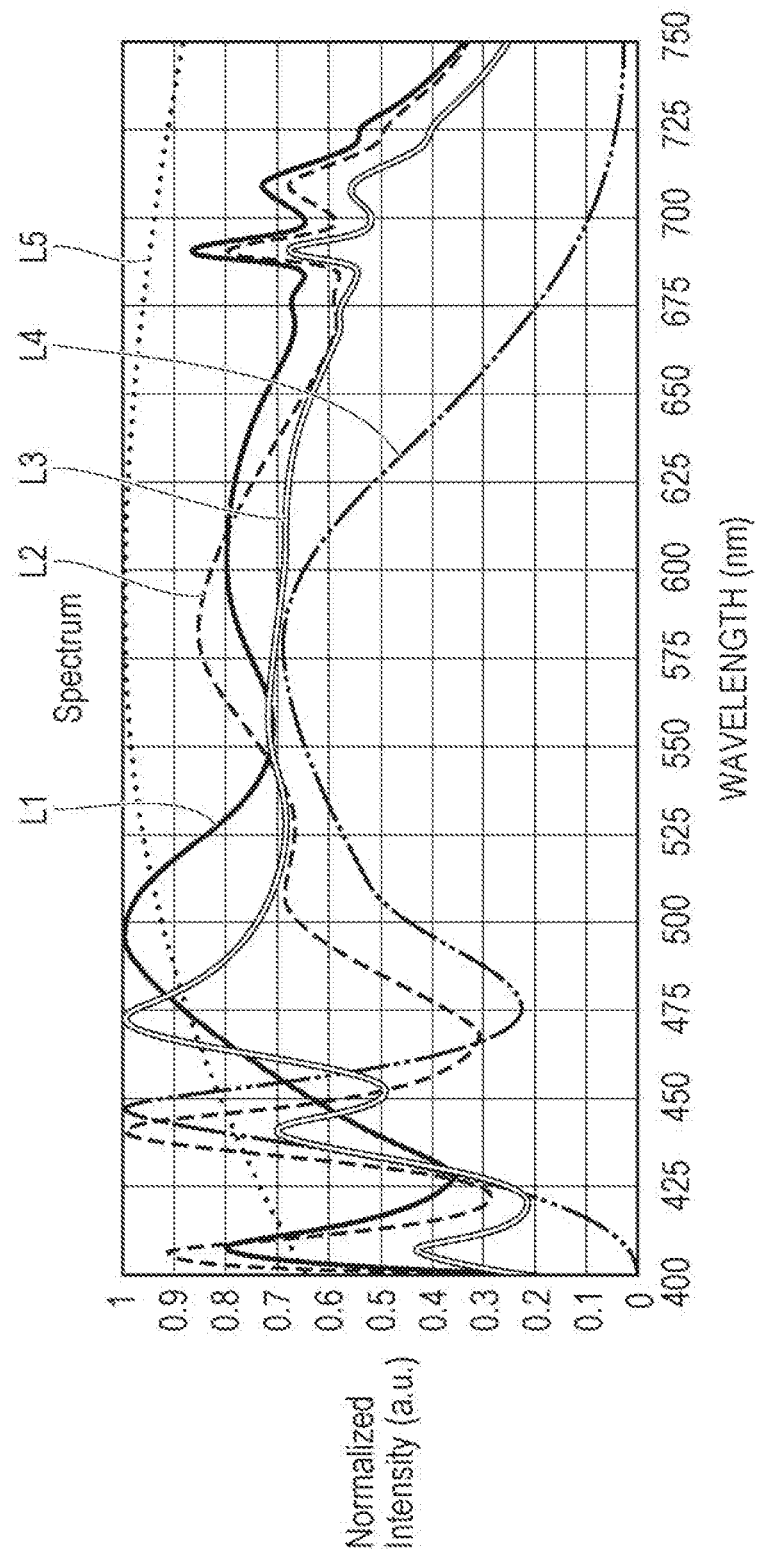
FIG. 11 is a graph showing the optical characteristics of light emitted from the light source devices in embodiments 1 to 3 of the present invention.

In embodiment 11 of the invention, the optical characteristics of the light source devices in embodiments 1 to 3 (hereinafter denoted as "light source devices in Examples") were examined. FIG. 11 is a graph illustrating the optical characteristics of the light emitted from each of the light source devices in the Examples in FIG. 11, L1 represents the spectrum of the light emitted from the light source device 11 in embodiment 1; L2 represents the spectrum of the light emitted from the light source device 12 in embodiment 2; L3 represents the spectrum of the light emitted from the light source device 13 in embodiment 3; L4 represents the spectrum of light emitted from a conventional LED light source device; and L5 represents the spectrum of light emitted from a standard light source. Each of L4 and L5 is a spectrum when the correlated color temperature of the light emitted from the corresponding light source device is 5,000K.

Table 1 shows the ratio of the minimum emission intensity to the maximum emission intensity is a wavelength range of from 400 nm to 750 nm inclusive in each of the three emission spectrums shown in FIG. 11. Table 2 shows the phosphors used in embodiments 1 to 3 and their content (% by weight). In each of embodiments 1 to 3, the phosphor-containing sealing resin layer contains, as a diffusing agent, silica particles with a secondary diameter of less than 10 μm in an amount of 0.5 wt % by percent by mass.

TABLE 1

|  | Minimum emission intensity/ maximum emission intensity | Wavelength giving maximum emission intensity | Wavelength giving minimum emission intensity |
|---|---|---|---|
| L1: Embodiment 1 of invention | 33% | 495 nm | 750 nm |
| L2: Embodiment 2 of invention | 29% | 440 nm | 420 nm |
| L3: Embodiment 3 of invention | 22% | 475 nm | 420 nm |
| L4: Conventional LED light source | 1% | 445 nm | 400 nm |

TABLE 1-continued

|  | Minimum emission intensity/ maximum emission intensity | Wavelength giving maximum emission intensity | Wavelength giving minimum emission intensity |
|---|---|---|---|
| L5: Standard light source | 65% | 595 nm | 400 nm |

TABLE 2

|  |  | Embodiment 1 | Embodiment 2 | Embodiment 3 |
|---|---|---|---|---|
| Far-red phosphor | Cr-activated GGG phosphor | 26.6 wt % | 15.5 wt % | 14.8 wt % |
| Red phosphor | Ce-activated α-SiAlON | 2.2 wt % | 1.3 wt % | 0.9 wt % |
| Red phosphor | Eu-activated $Sr_xCa_{1-x}AlSiN_3$ | 2.2 wt % | 1.2 wt % | 1.7 wt % |
| Green phosphor | Ce-activated $Lu_3Al_5O_{12}$ | 0.0 wt % | 3.5 wt % | 6.6 wt % |
| Green phosphor | Eu-activated β-SiAlON | 1.0 wt % | 3.1 wt % | 6.8 wt % |
| Blue phosphor | Eu-activated halophosphoric acid | 16.8 wt % | 0.0 wt % | 0.0 wt % |

The light source device 11 in embodiment 1 includes the first light emitting element (the peak wavelength of the output light: 405 nm) and contains Cr-activated $Gd_3Ga_5O_{12}$ as a far-red phosphor, Ce-activated α-SiAlON and Eu-activated $Sr_xCa_{1-x}AlSiN_3$ as red phosphors, Eu activated β-SiAlON as a green phosphor, and Eu-activated halophosphoric acid as a blue phosphor.

The light source device 12 in embodiment 2 includes the first light emitting element (the peak wavelength of the output light: 405 nm) and the second light emitting element (the peak wavelength of the output light: 445 nm) and contains Cr-activated $Gd_3Ga_5O_{12}$ as a far-red phosphor, Ce-activated α-SiAlON and Eu-activated $Sr_xCa_{1-x}AlSiN_3$ as red phosphors, and Eu activated β-SiAlON as a green phosphor.

The light source device 13 in embodiment 3 includes the first light emitting element (the peak wavelength of the output light: 405 nm), the second light emitting element (the peak wavelength of the output light: 445 nm), and the third light emitting element (the peak wavelength of the output light: 470 nm) and contains Cr-activated $Gd_3Ga_5O_{12}$ as a far-red phosphor, Ce-activated α-SiAlON and Eu-activated $Sr_xCa_{1-x}AlSiN_3$ as red phosphors, and Eu activated β-SiAlON as a green phosphor.

The conventional LED light source shown as a comparative example includes the second light emitting element (the peak wavelength of the output light: 445 nm) and contains $Lu_3Al_5O_{12}:C^{3+}$ as a green phosphor and $Sr_xCa_{1-x}AlSiN_3:Eu^{2+}$ as a red phosphor.

The emission spectrums shown in FIG. 11 were obtained by measurement using an integrating sphere and a spectrophotometer. To obtain the optical characteristics of a light source device, a constant current was applied for a short time to cause the light source device to emit light, and its emission spectrum was thereby obtained.

Moreover, the emission spectrum of each light source device with no phosphor-containing sealing resin layer formed was obtained to confirm that each light emitting element mounted on the light source device had a peak in the corresponding target wavelength range. Then, a sealing resin layer containing various phosphors was formed.

As can be seen from FIG. 11 and Table 1, the ratio of the minimum emission intensity to the maximum emission intensity is higher in the light emitted from each of the light source devices 11, 12, and 13 in embodiments 1 to 3 than in the light emitted from the light source device in the reference example, and the light emitted from each of the light source devices 11, 12, and 13 has an emission spectrum close to that of the standard light source. Therefore, by using any of the light source devices in the Examples, light emitting devices for illumination applications with high color rendering properties and highly versatile sensing devices may be produced. The light emitted from each of the light source devices 11, 12, and 13 in embodiments 1 to 3 satisfies the following characteristic A.

Characteristic A: The ratio of the minimum emission intensity to the maximum emission intensity in a wavelength range of from 400 nm to 750 nm inclusive is 20% or more.

Another Embodiment

A combination of two or more of the light source devices in embodiments 1 to 10 may be used as a light source of a light emitting device.

It should be noted that the embodiments and examples disclosed herein are illustrative and non-restrictive in every respect. The scope of the present invention is defined not by the preceding description but instead by the scope of the claims and is intended to include any modifications within the scope and meaning equivalent to the scope of the claims.

REFERENCE SIGNS LIST 11, 12, 13, 14, 15, 16, 17, 17', 18, 19, 19', 20, 20' light source device, 311 frame, 411, 511, 512 substrate, 101 first light emitting element, 102 second light emitting element, 103 third light emitting element, 201 fourth light emitting element, 202 fifth light emitting element, 203 sixth light emitting element, 321, 322, 421, 422, 521, 522, 523, 524 electrode 1 and, 451 resin dam, 551 dam ring, 361, 461, 561, 562 resin, 371, 471, 571 first phosphor-containing resin layer, 572 second phosphor-containing resin layer, 611 far-red phosphor, 621 red phosphor, 631 green phosphor, 641 blue phosphor

The invention claimed is:

1. A light source device comprising: at least one light emitting element of at least one type; at least one far-red phosphor that, when excited by output light from the at least one light emitting element, emits light having a peak in a wavelength range of 680 nm or more to less than 780 nm; and at least one phosphor that, when excited by the output light from the at least one light emitting element, emits light having a peak in a wavelength range different from the wavelength range of the light emitted from the far-red phosphor,
   wherein the spectrum of light emitted from the light source device has the following characteristic A:
   characteristic A: the ratio of a minimum emission intensity to a maximum emission intensity in a wavelength range of from 400 nm to 750 nm inclusive is 20% or more.

2. The light source device according to claim 1, wherein the at least one far-red phosphor comprises $(Ln_{1-x}Cr_x)_3M_5O_{12}$ (where Ln is at least one element selected from Y, La, Gd, and Lu; is at least one element selected from Al, Ga, and In; and x is a number satisfying $0.005 \leq x \leq 0.2$).

3. The light source device according to claim 2, wherein, when light is emitted from all of the at least one light emitting element mounted on the light source device with no phosphors mounted thereon, the light emitted has a peak wavelength in a first wavelength range of 380 nm or more to less than 420 nm and a peak in a second wavelength range of 420 nm or more to less than 490 nm.

4. A light emitting device comprising the light source device according to claim 1.

5. A light source device comprising: at least one light emitting element of at least one type; at least one far-red phosphor that, when excited by output light from the at least one light emitting element, emits light having a peak in a wavelength range of 680 nm or more to less than 780 nm; at least one green phosphor; and at least one red phosphor,
   wherein the spectrum of light emitted from the light source device has the following characteristic A:
   characteristic A: the ratio of a minimum emission intensity to a maximum emission intensity in a wavelength range of from 400 nm to 750 nm inclusive is 20% or more.

6. The light source device according to claim 5, wherein the at least one light emitting element has at least an emission peak in a wavelength range of 380 nm or more to less than 420 nm, and wherein the tight source device further comprises at least one blue phosphor that is excited by the output light from the at least one light emitting element.

* * * * *